United States Patent
Lo et al.

(10) Patent No.: US 9,673,132 B2
(45) Date of Patent: Jun. 6, 2017

(54) INTERCONNECTION STRUCTURE WITH CONFINEMENT LAYER

(71) Applicant: Taiwan Semiconductor Manufacturing Company, Ltd., Hsin-Chu (TW)

(72) Inventors: Hsiao Yun Lo, Hsin-Chu (TW); Yung-Chi Lin, Su-Lin (TW); Yang-Chih Hsueh, Hsin-Chu (TW); Tsang-Jiuh Wu, Hsin-Chu (TW); Wen-Chih Chiou, Zhunan Township (TW)

(73) Assignee: Taiwan Semiconductor Manufacting Company, Ltd., Hsin-Chu (TW)

( * ) Notice: Subject to any disclaimer, the term of this patent is extended or adjusted under 35 U.S.C. 154(b) by 0 days.

(21) Appl. No.: 14/511,006

(22) Filed: Oct. 9, 2014

(65) Prior Publication Data

US 2015/0054174 A1    Feb. 26, 2015

Related U.S. Application Data

(60) Continuation-in-part of application No. 14/299,886, filed on Jun. 9, 2014, now Pat. No. 8,980,741, which (Continued)

(51) Int. Cl.
*H01L 23/48*    (2006.01)
*H01L 21/768*   (2006.01)

(Continued)

(52) U.S. Cl.
CPC ........ *H01L 23/481* (2013.01); *H01L 21/7685* (2013.01); *H01L 21/76898* (2013.01); *H01L 23/53214* (2013.01); *H01L 23/53228* (2013.01); *H01L 23/53242* (2013.01); *H01L 24/03* (2013.01); *H01L 24/05* (2013.01); *H01L 21/2885* (2013.01); *H01L 21/76885* (2013.01); *H01L 23/525* (2013.01); *H01L 24/13* (2013.01);

(Continued)

(58) Field of Classification Search
CPC ............ H01L 23/481; H01L 23/53228; H01L 21/76898
USPC .......................... 257/774, 781; 438/653, 660
See application file for complete search history.

(56) References Cited

U.S. PATENT DOCUMENTS 5,175,125 A * 12/1992 Wong .................... H01L 21/321
                                                          257/E21.3
7,279,411 B2   10/2007 Agarwala et al.

(Continued)

*Primary Examiner* — David Vu
*Assistant Examiner* — Brandon Fox
(74) *Attorney, Agent, or Firm* — Slater Matsil, LLP

(57) ABSTRACT

An interconnection structure and method disclosed for providing an interconnection structure that includes conductive features having reduced topographic variations. The interconnection structure includes a contact pad disposed over a substrate. The contact pad includes a first layer of a first conductive material and a second layer of a second conductive material over the first layer. The first conductive material and the second conductive material are made of substantially the same material and have a first average grain size and a second average grain size that is smaller than the first average grain size. The interconnection structure also includes a passivation layer covering the substrate and the contact pad, and the passivation layer has an opening exposing the contact pad.

20 Claims, 15 Drawing Sheets

Related U.S. Application Data is a division of application No. 13/457,841, filed on Apr. 27, 2012, now Pat. No. 8,772,945.

(51) Int. Cl.
*H01L 23/00* (2006.01)
*H01L 23/532* (2006.01)
H01L 21/288 (2006.01)
H01L 23/525 (2006.01)

(52) U.S. Cl.
CPC ............... *H01L 2224/0345* (2013.01); *H01L 2224/0347* (2013.01); *H01L 2224/0391* (2013.01); *H01L 2224/03462* (2013.01); *H01L 2224/03616* (2013.01); *H01L 2224/0401* (2013.01); *H01L 2224/04042* (2013.01); *H01L 2224/04073* (2013.01); *H01L 2224/05005* (2013.01); *H01L 2224/05018* (2013.01); *H01L 2224/0518* (2013.01); *H01L 2224/05023* (2013.01); *H01L 2224/05025* (2013.01); *H01L 2224/05026* (2013.01); *H01L 2224/0558* (2013.01); *H01L 2224/0568* (2013.01); *H01L 2224/05099* (2013.01); *H01L 2224/05124* (2013.01); *H01L 2224/05147* (2013.01); *H01L 2224/05155* (2013.01); *H01L 2224/05157* (2013.01); *H01L 2224/05164* (2013.01); *H01L 2224/05166* (2013.01); *H01L 2224/05181* (2013.01); *H01L 2224/05184* (2013.01); *H01L 2224/05541* (2013.01); *H01L 2224/05567* (2013.01); *H01L 2224/05568* (2013.01); *H01L 2224/05571* (2013.01); *H01L 2224/05624* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05681* (2013.01); *H01L 2224/05684* (2013.01); *H01L 2224/1131* (2013.01); *H01L 2224/1134* (2013.01); *H01L 2224/11849* (2013.01); *H01L 2224/13111* (2013.01); *H01L 2224/13116* (2013.01); *H01L 2224/13139* (2013.01); *H01L 2224/13147* (2013.01); *H01L 2924/00011* (2013.01); *H01L 2924/00014* (2013.01); *H01L 2924/01322* (2013.01); *H01L 2924/12042* (2013.01)

(56) References Cited

U.S. PATENT DOCUMENTS

| | | | |
|---|---|---|---|
| 7,741,226 B2 | 6/2010 | Andry et al. | |
| 7,977,133 B2 * | 7/2011 | Yoo | H01L 33/0079 257/615 |
| 8,232,648 B2 | 7/2012 | McGahay et al. | |
| 8,772,945 B2 | 7/2014 | Lin et al. | |
| 8,803,292 B2 | 8/2014 | Chen et al. | |
| 2008/0211098 A1 * | 9/2008 | Suzuki | H01L 21/2885 257/751 |
| 2010/0084747 A1 | 4/2010 | Chen et al. | |
| 2011/0193199 A1 | 8/2011 | Filippi et al. | |
| 2011/0193226 A1 | 8/2011 | Kirby et al. | |
| 2011/0316169 A1 * | 12/2011 | Sunohara | H01L 21/486 257/774 |
| 2012/0112322 A1 | 5/2012 | Lin et al. | |
| 2012/0133030 A1 | 5/2012 | Wang et al. | |
| 2013/0098665 A1 * | 4/2013 | Ishii | H05K 3/108 174/254 |
| 2013/0175689 A1 * | 7/2013 | Chuang | H01L 24/03 257/751 |
| 2013/0285125 A1 | 10/2013 | Chen et al. | |
| 2014/0021633 A1 | 1/2014 | Lee et al. | |
| 2014/0084473 A1 * | 3/2014 | Moon | H01L 21/76877 257/751 |
| 2014/0287581 A1 | 9/2014 | Lin et al. | |
| 2015/0061115 A1 * | 3/2015 | Chen | H01L 24/13 257/737 |
| 2015/0206823 A1 | 7/2015 | Lin et al. | |

* cited by examiner

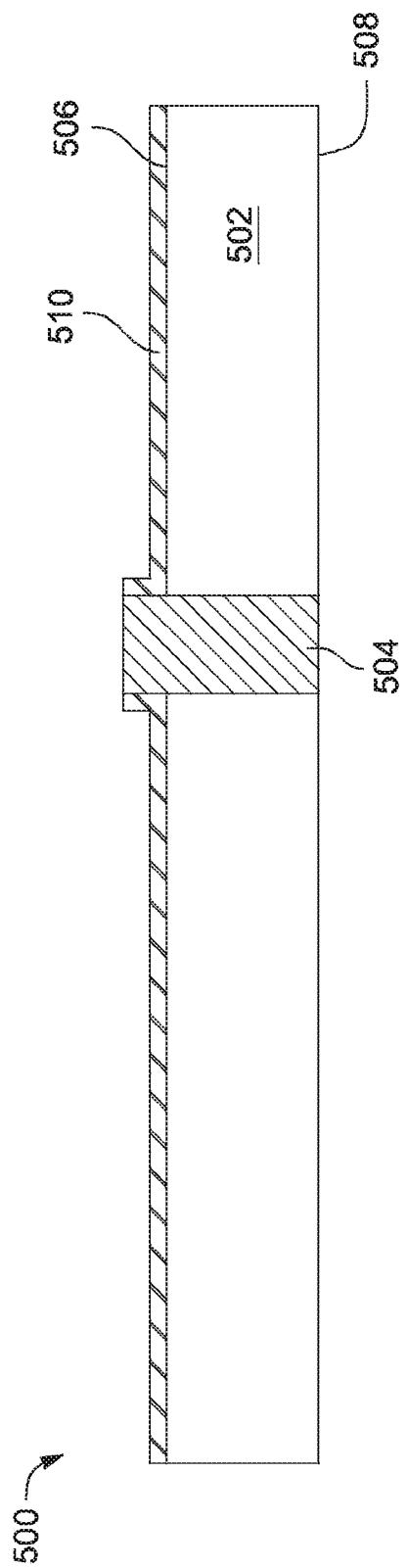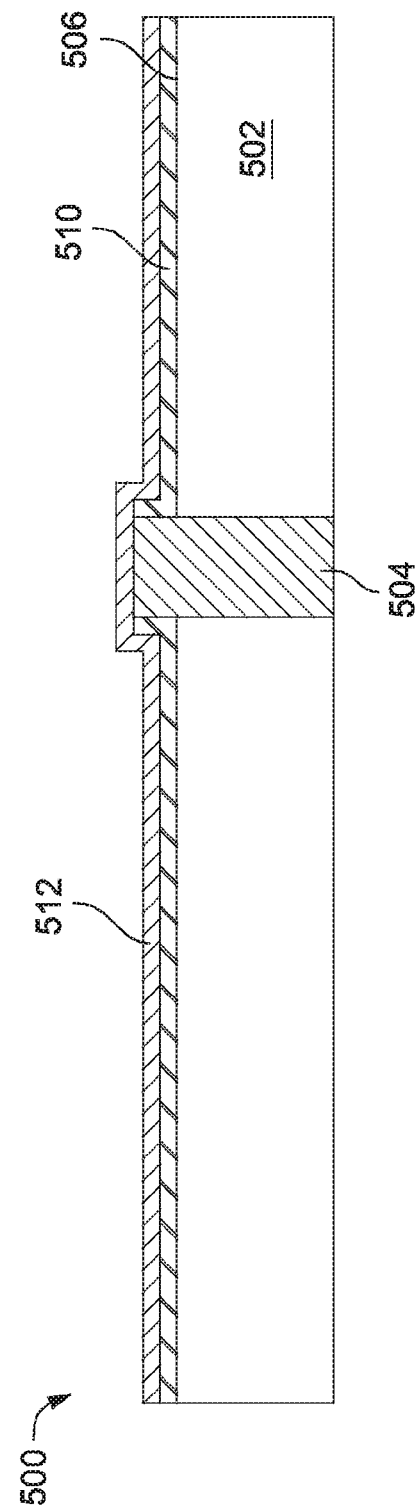
FIG. 5A
FIG. 5B

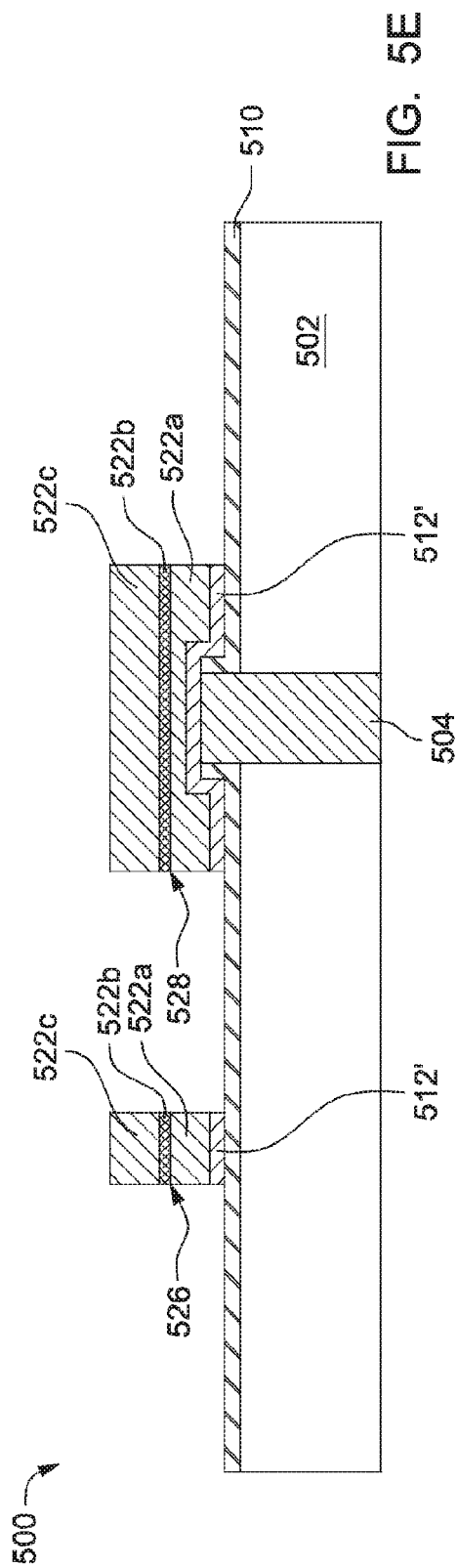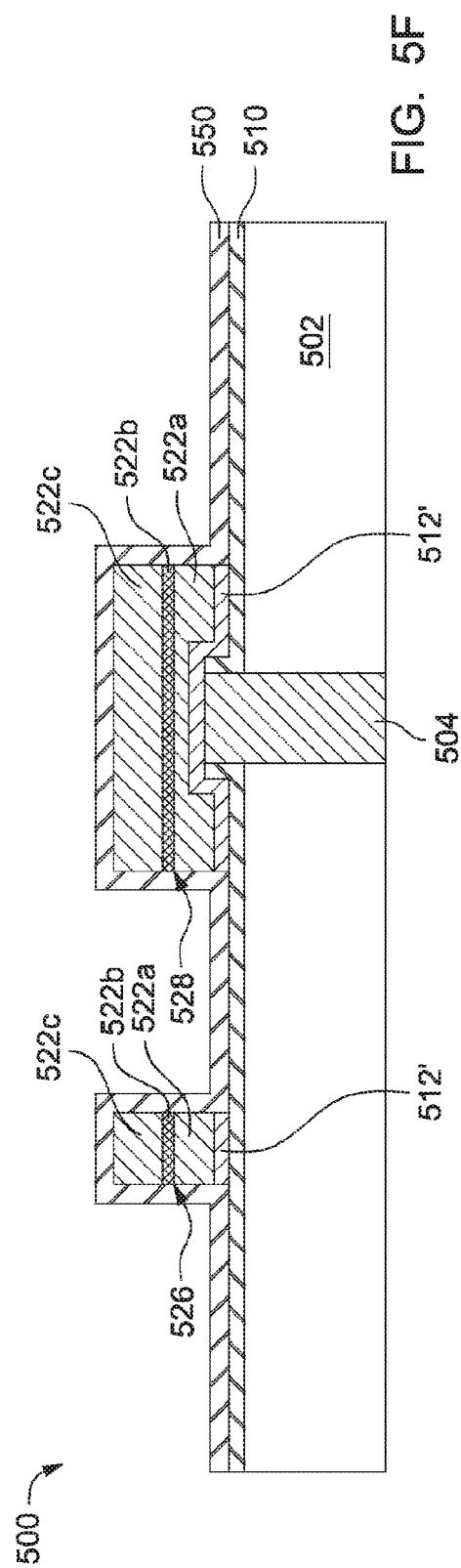

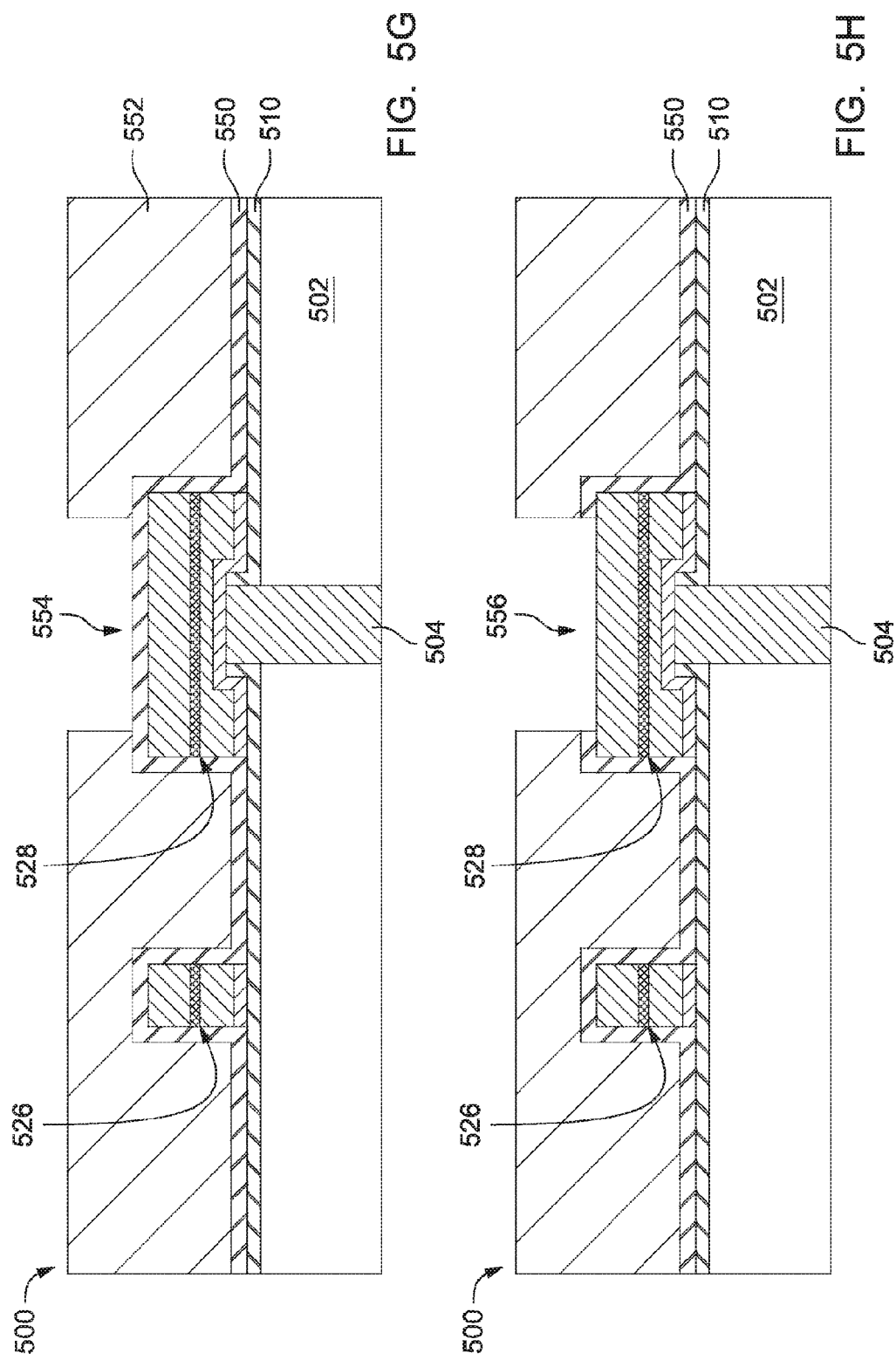

INTERCONNECTION STRUCTURE WITH CONFINEMENT LAYER

PRIORITY

The present application is a continuation-in-part of U.S. application Ser. No. 14/299,886 filed Jun. 9, 2014, which is a divisional application of U.S. application Ser. No. 13/457,841 filed Apr. 27, 2012 (now issued as U.S. Pat. No. 8,772,945), the entirety of which is incorporated herein by reference.

BACKGROUND

Generally, one of the driving factors in the design of modern electronics is the amount of computing power and storage that can be shoehorned into a given space. One method used to pack more computing power into a given space and reduce the distance between various chips forming a system is to stack chips, with interconnects running vertically. Embedded interconnects, or metal filled vias in a substrate, are commonly called through silicon vias or through substrate vias ("TSVs"). TSVs can be used to connect chips on opposite sides of a substrate, or provide chip level connections through the body of the chip.

TSVs are also used to create 3D integrated circuits, and are advantageous over wire bonding or other connection techniques because the density of the vias is substantially higher, and because the length of the connections is shorter. A 3D package such as System in Package, Chip Stack Multi-Chip Module (MCM), etc. contains two or more chips (integrated circuits) stacked vertically so that they occupy less space and/or have greater connectivity. An alternate type of 3D package is Silicon Carrier Packaging Technology, where ICs are not stacked but a carrier substrate containing TSVs is used to connect multiple ICs together in a package. In most 3D packages, the stacked chips are wired together along their edges and this edge wiring slightly increases the length and width of the package and usually requires an interposer layer between the chips. In some 3D packages, through-silicon vias replace edge wiring by creating vertical connections through the body of the chips. The resulting package has no added length or width. Because no interposer is required, a TSV 3D package can also be flatter than an edge-wired 3D package. This TSV technique is sometimes also referred to as TSS (Through-Silicon Stacking or Thru-Silicon Stacking.) A 3D integrated circuit (3D IC) is a single integrated circuit built by stacking silicon wafers and/or dies and interconnecting them vertically so that they behave as a single device. By using TSV technology, 3D ICs can pack a great deal of functionality into a small footprint. The different dies in the stack may be heterogeneous, e.g. combining CMOS logic, DRAM and III-V materials into a single IC.

The use of silicon as an interposer or substrate is not required, even though the term refers to the vias being in silicon. These interposer substrates are commonly silicon, glass or some other insulator, with copper, gold, or other conductors disposed in the vias through the interposer.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 5A through 5I are cross-sectional views of intermediate steps in forming a semiconductor device that includes an interconnection structure having a confinement layer in accordance with some embodiments of the present disclosure;

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely through silicon via (TSV) construction. Other embodiments may also be applied, however, to other electrical structures, including, but not limited to, conductive interconnects, redirection layers, ball grid arrays, die mounting structures, or any other conductive structure. Additionally, while the presented principles are described with reference to providing a TSV having a barrier pad and being disposed in a substrate used in package level processing, such as flip chip packaging, skilled artisans will recognize that that the same principles may be advantageously applied to other scales as well. The presented principles may be applied to, for example, higher level packaging, such as printed circuit boards, or to die level manufacturing, such as vias disposed in semiconductor substrate material as connections through the body of the chip as used in 3D packages or 3D integrated circuits to replace edge wiring interconnect systems.

The present inventive concepts are directed to providing embedded interconnects, or through silicon vias, with a barrier pad to reduce surface distortions. A barrier pad may be disposed under a conductive pad in the TSV at a depth sufficient to reduce the average size of metallic crystals in the surface conductive pad, and create a smoother surface for attaching interconnects.

Figure 1A:
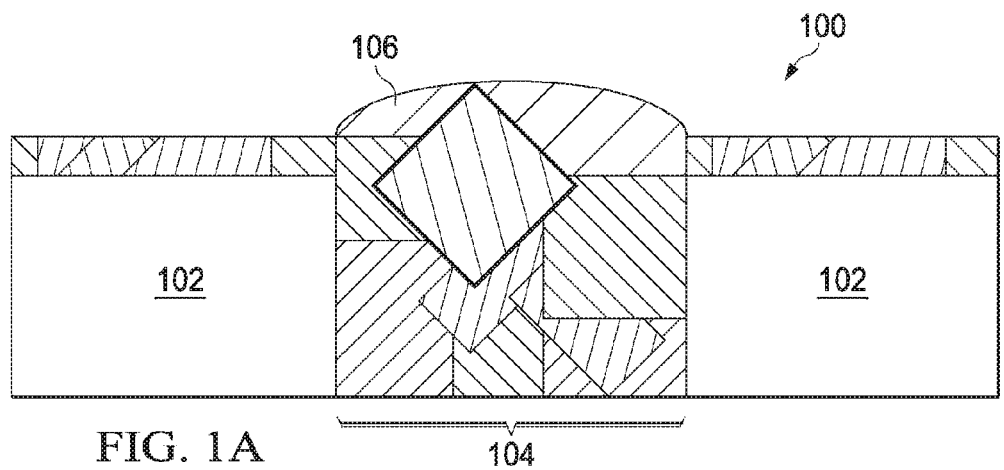
FIG. 1A is a cross-sectional diagram illustrating typical deposition of TSV material on a substrate.

With reference now to FIG. 1A, a cross-sectional diagram of a typical deposition of TSV material on a substrate 100 is shown. A TSV 104 is formed when a via is formed in a substrate 102 and a conductive TSV material 106 is deposited on the substrate 102. Ideally, TSV material 106 should completely fill the via. Voids or other physical imperfections in the filling of the via by the TSV material 106 may alter the conductive properties of the TSV 104. In depositing individual layers of TSV material 106, it is preferable to have the TSV material fill the length and width of the via.

A TSV 104 commonly has a diameter between 1 and 20 microns. However, a TSV 104 may have a diameter with any appropriate size. TSVs 104 may be intended to carry a particular current, and thus, an appropriate minimum diameter may be determined based on the height of the TSV 104 (and by extension, the thickness of the substrate 102), the resistance of the TSV material 106, and the required current capacity. Additionally, the maximum diameter of a TSV 104 is only practically limited by the desired density of TSVs 104.

TSV material 106 may consist of a variety of conductive materials as well Skilled artisans will recognize that copper (Cu) may be a commonly used TSV material 106, and is advantageous due to its low cost. Alternatively, gold (Au), palladium (Pd), nickel (Ni), gold-nickel alloy (AuNi), titanium (Ti), aluminum, (Al) or any other sufficiently conductive material may also be advantageously used as a TSV material 106.

One feature displayed in metallic TSV material 106 is a metallic grain structure. Any piece of metal is made up of a large number of crystal grains, which are regions of regularity in the packing structure of the metallic atoms. At the grain boundaries, atoms become misaligned creating irregularities known as dislocations. Metallurgical processing such as alloying, cold working, annealing, and tempering can change the arrangement and size of metallic grains. Cold working, for example, breaks up the larger grain structures making a metal harder and more brittle, while annealing uses heat followed by slow cooling to soften the metal through the growth of large grain structures.

Copper (Cu), aluminum (Al), silver (Ag) and gold (Au) form metallic crystal structures with a face centered cubic lattice, resulting in cubic, octahedron, dodecahedron and related crystal morphologies. In contrast, titanium (Ti), zinc (Zn) and cadmium (Cd) form hexagonal crystal lattices, while tungsten (W) and molybdenum (Mo) form body centered cubic crystal lattices. While some metals form the same type of lattice, it should be noted that the spacing of the lattices can be different, creating crystal structure discontinuities at the interface then two metals are deposited together. Therefore, the metal type may dictate the crystal lattice, which may, in turn dictate the average size and shape of the metallic grain structures in a TSV 104. Any "seeding", or influence of the metallic grain structure by pre-existing chemistry, may also affect the average grain size of a metal used in a TSV 104.

TSV material 106 may be deposited in any suitable manner, including, but not limited to electroplating, immersion, chemical vapor deposition, sputtering, plasma enhanced chemical vapor deposition, or the like. However, the deposition method may dictate the formation and physical qualities of grain boundaries in the TSV material 106. The size and geometry of the via may also dictate the size and physical qualities of the crystal grains developed in the TSV material. For example, a narrow diameter via will have smaller average grain structures than a wider via.

Electroplating copper (Cu) is an inexpensive method for depositing an inexpensive material to form a TSV 104. In such a process, TSV material 106 may be deposited in a TSV 104 and on a substrate 102 target surface at the same time, as shown. With the deposition of TSV material 106 extending above the surface of the substrate 102, one or more grain structures may sit proud, or extending above, the substrate's 102 upper, or target surface.

Figure 1B:
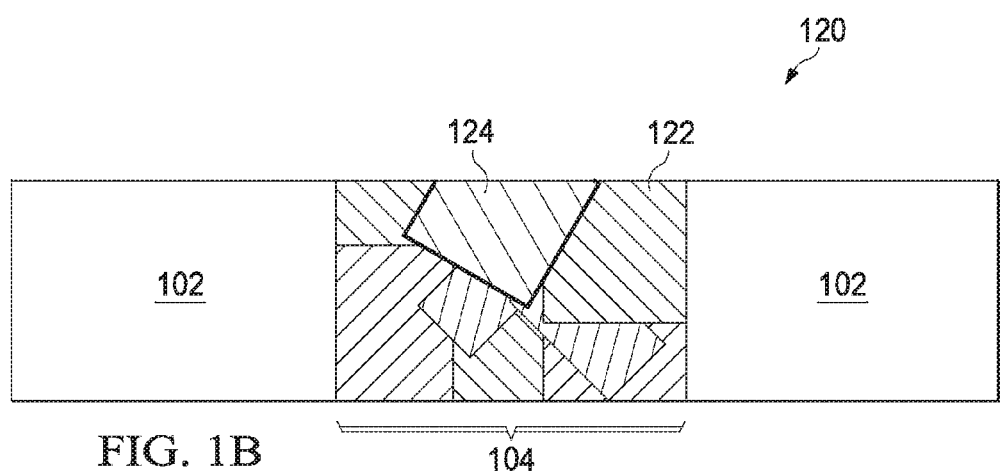
FIG. 1B is a cross-sectional diagram illustrating a typical TSV and substrate after polishing.

Referring now to FIG. 1B, a cross-sectional view of a TSV and substrate after polishing 120 is depicted. In instances where TSV material 106 is deposited on the substrate and in the via, the TSV material 106 may be ground or polished so that the polished TSV material 122 in the TSV 104 and the substrate form a flat, uniform surface. This may be accomplished by mechanical or chemical-mechanical polishing. However, one issue encountered when polishing metals having large grain structures is that individual crystal grains may be sheared at the polish interface, or may be compressed and/or rearranged in the crystalline metal matrix. The proud grain 124, is displaced into the polished TSV material 106, and is also shown as being sheared, where the regular grain structure has been disrupted.

Figure 1C:
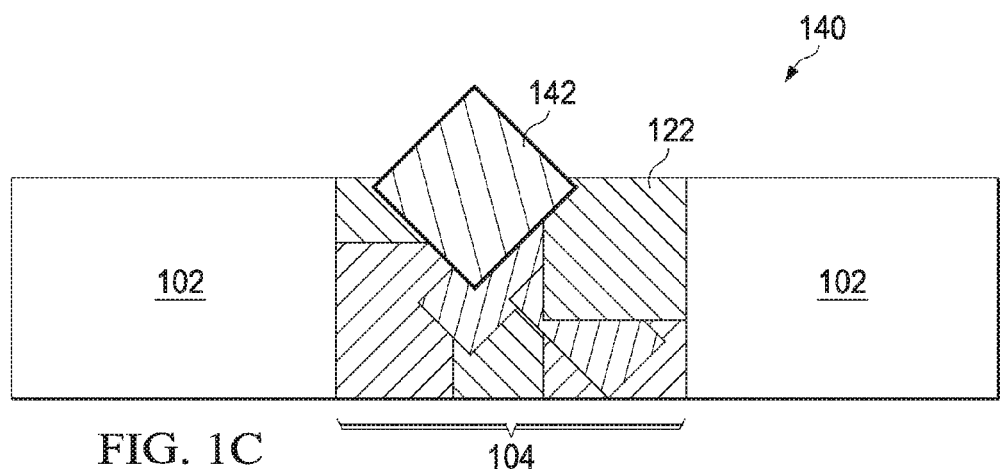
FIG. 1C is a cross-sectional diagram illustrating surface diffusion and grain reorientation in a typical TSV.

FIG. 1C is a cross-sectional view of a TSV 104 exhibiting surface diffusion and grain reorientation 140. During processing of semiconductor material, including semiconductor substrates having TSVs 104, substrates 102 are frequently heated to temperatures affecting the metallic structure of the TSV 104. For example, after doping, a semiconductor may be heated to drive in any deposited doping substances. Alternatively, annealing of semiconductor wafers is a common practice where a wafer or other substrate is heated and slowly cooled to relieve stress in, and soften, the semiconductor substrate.

The surface finishing of TSV material 106 to smooth the TSV 104 surface and level it to the substrate target surface 102 creates stresses in the metallic grain structures, particularly at the surface. Heating the substrate 102 and TSV 104 during processing allows the metallic grain structure to become more mobile, relieving the stresses in the metallic grain structure. The grain structures 142 are able to move into a position, and re-form structures, requiring less energy to maintain the new position or structure. For example, a portion of the proud grain structure 142 has risen above the plane of the substrate 102 surface and polished TSV 122 surface due to the mobility permitted by heat processing of the structure. This may be a grain structure 142 that was dislocated during the polishing process, combined with the heat of processing allowing the grain to return to a less energetic location. Alternatively, the grain structure 142 may have been cut, abraded or otherwise removed. In such an instance, heat treating may allow reformation of the grain structure, resulting in a proud grain structure 142.

The top of a polished TSV surface 122 may be used as a pad for mounting wire bonds, other metal mounting pads, solder pads, solder balls, redirection layers, or any other conductive interface. In order for a wire bond, solder ball or other metal-to-metal connection to bond effectively, a polished TSV surface 122 will ideally be as smooth as possible. Generally, the smoother the target surface, the better the bond. While the smallest polished TSV surface 122 features are desirable, there is some tolerance for surface irregularities or topography variations, the size of such topography variations is dependent on the size of the features in the device. For example, in devices created with 20 nanometer fabrication processes, surface features or topography variations less than about 100 angstroms may be tolerable, while in devices created with 45 nanometer fabrication processes, surface features or topography variations less than about 500 angstroms may be tolerable.

Providing the smoothest possible TSV surface allows a higher yield in package production when mounting electrical conductors to a polished TSV surface. The presented principles are directed to providing a TSV structure with smaller grain structures that cause less surface distortion on the TSV. In particularly useful embodiments, a barrier pad may be deposited below the surface of the TSV to prevent the formation of large scale grain structures at the surface of the TSV.

Figure 2A:
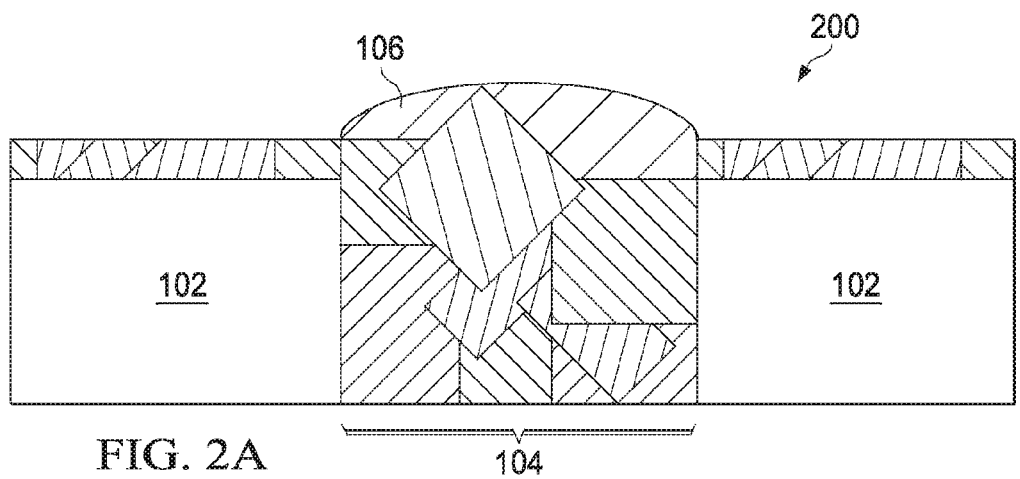
FIG. 2A is a cross-sectional diagram illustrating an embodiment of deposition of TSV material in preparation for creation of a barrier pad structure.

Referring now to FIG. 2A, TSV material 106 deposited on a substrate 102 in preparation for creation of a barrier pad structure 200 is shown in cross-section. In particularly useful embodiments, copper (Cu) may be deposited on the substrate 102 target surface by a chemical vapor deposition process. However, any conductive material may be advantageously used for a TSV 104, such as, but not limited to, gold (Au), nickel (Ni), nickel-gold alloys (NiAu), titanium (Ti), aluminum (Al), molybdenum (Mo), tantalum (Ta), tungsten (W) or the like. Similarly, any suitable deposition process may be used to deposit a conductive material for the TSV 104, including, but not limited to chemical vapor deposition (CVD), molecular beam epitaxy (MBE), sputtering, electroplating, or the like. The TSV material 106 will be reduced lower than the height of the via to form a bottom TSV pad.

Figure 2B:
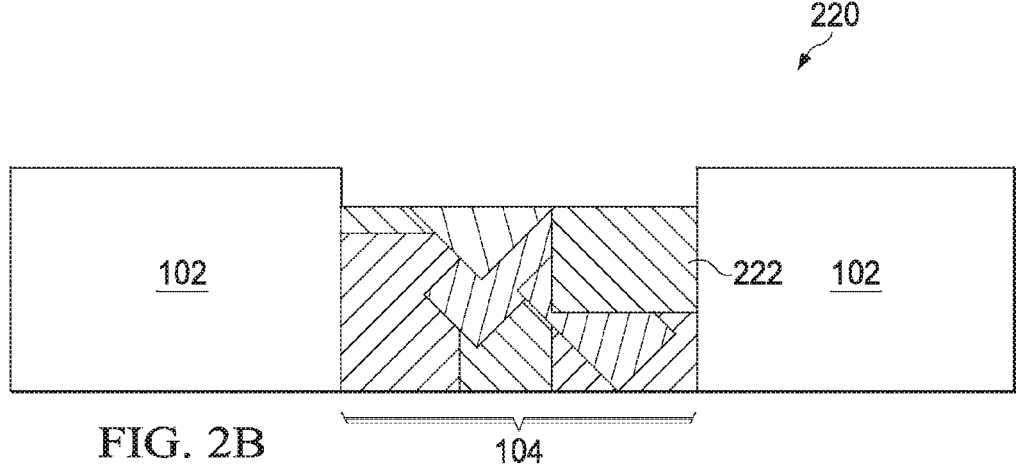
FIG. 2B is a cross-sectional diagram of a TSV structure after a metal only first chemical mechanical polish.

FIG. 2B illustrates a cross-sectional view of a TSV 104 structure after a first, metal-only polish 220. In particularly useful embodiments, the first polish will reduce the surface of the TSV material 222 below the surface of the substrate 102. Here, the object of the metal-only polish is to remove TSV material 106 without affecting the substrate 102. Such a metal only polish preferably creates a flat and even surface in the TSV material 222 so that subsequent layers have an even thickness with respect to the substrate 102 surface. Additionally, while the metal removal is referred to as a polish, physical abrasion is not required. A chemical polish, such as, but not limited to, nitric acid or ferric chloride etchant, may be advantageously employed. Alternatively, a well-known side effect of standard CMP processes that may be advantageously employed is dishing of copper. During a CMP the copper may be removed faster than the more durable substrate surface, resulting in a copper feature surface lower than the substrate surface.

Figure 2C:
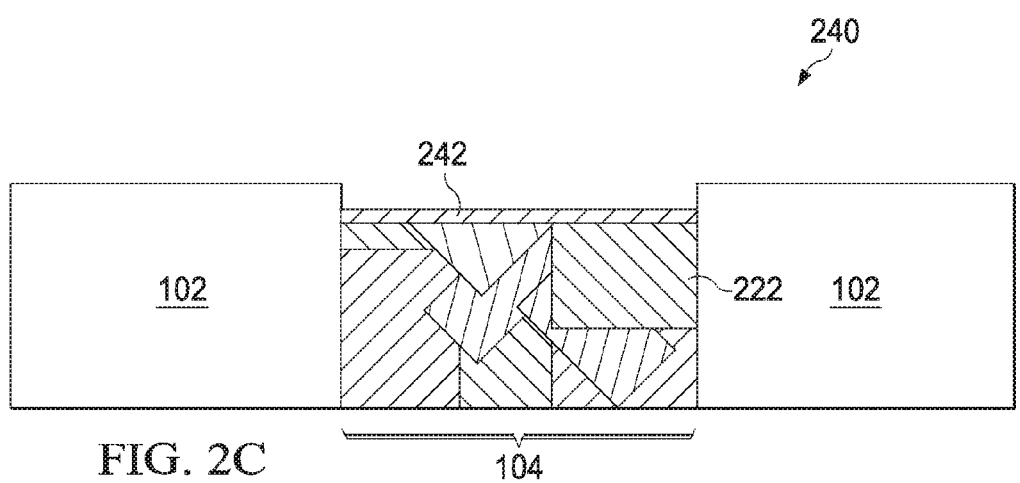
FIG. 2C is a cross-sectional diagram of a TSV structure with an embodiment of a barrier pad.

FIG. 2C illustrates a cross sectional view of a TSV structure with a barrier pad 242 applied 240. A barrier pad 242 may be formed of a conductive material, such as a metal, or any other material having a resistance low enough to suitably conduct electricity. Additionally, material having a crystal or grain structure dissimilar enough from the TSV 222 material to prevent the barrier pad from acting as a seed layer for crystal growth may be advantageous. For example, when using copper (Cu) TSV material 222, a barrier pad 242 of tantalum (Ta), cobalt (Co), titanium (Ti), nickel (Ni) or the like may be advantageously applied. Each of those specified metals are relatively inexpensive, and may be deposited using a chemical vapor deposition process, while exhibiting sufficient adhesion to the copper TSV material 222 and sufficiently low resistance. While the previously disclosed barrier pad 242 materials may be used in one or more embodiments, skilled artisans will recognize that any other suitable material may also be used as a barrier pad 242.

A barrier pad 242 may be deposited in any thickness suitable to prevent the bottom TSV pad 222 from affecting the crystal growth of a top TSV section. However, the barrier pad 242 should also be deposited in a thin enough layer to prevent large scale grain formation in the barrier pad 242 itself. Thus, the barrier pad 242 thickness of sufficient thinness may be selected to prevent barrier pad surface topography variations greater than a predetermined size. In one useful embodiment, the barrier pad 242 may be less than about 5 microns thick.

The barrier pad may also be deposited by any known or as yet undiscovered deposition method. For example, the TSV 104 via area may be masked so that a CVD process applies barrier pad 242 material only in the TSV 104 via. Masking may permit avoidance of a barrier pad 242 polishing step, however, a generalized metal deposition process may be used, followed by removal of the barrier pad 242 material from the surface of the substrate 102. For example, the barrier pad 242 may be deposited through electroplating, and any barrier pad 242 material may be removed from the surface of the substrate 102 by a CMP process. Alternatively, a plasma vapor deposition process may be used Skilled practitioners will recognize that the various vapor deposition processes may result in barrier pad 242 material being deposited in the sidewalls of the TSV 104 via. Such sidewall deposits will be preferably thin enough in comparison to the TSV 104 via cross sectional area and top TSV pad 282 (see FIG. 2E) top surface area that the deposits will not interfere with the adherence of mounted elements to the top TSV 282 pad.

Figure 2D:
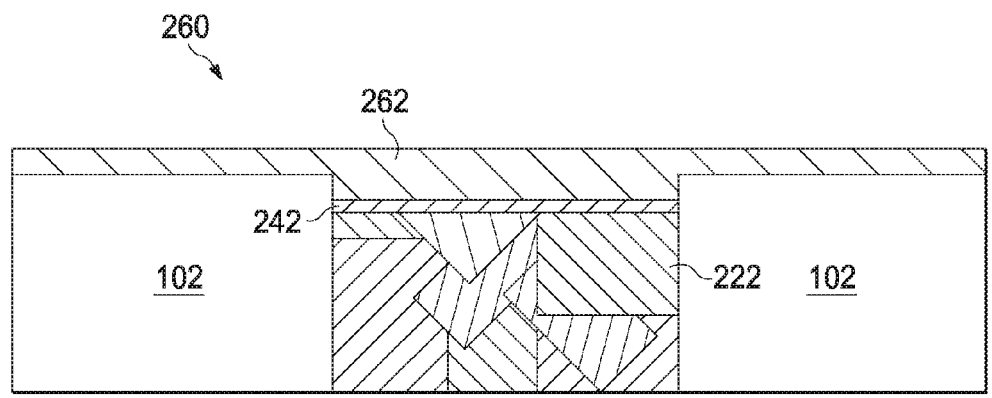
FIG. 2D is a cross-sectional diagram of a TSV structure with a second deposition of TSV material.

FIG. 2D illustrates a cross-section 260 of a TSV structure with a second deposition of TSV material 262. The second deposition of TSV material 262 will become the top TSV pad 282, which will advantageously be thin enough to prevent formation of crystal grain structures large enough to cause surface topography problems. In particularly useful embodiments, a top TSV pad 282 thickness of less than about 6 microns reduces surface topography features to within tolerable ranges, and particularly useful embodiments will have a top TSV pad thickness of 1 to 3 microns Skilled artisans will recognize that the thickness of the top TSV pad 282 will dictate the maximum topography variation, and that a particular top TSV pad 282 thickness will be associated with, or resulting in, a predetermined maximum topography variation. For example, depending on the top TSV pad 282 material, a 6 micron top TSV pad 282 thickness may result in surface topography variations of about 500 angstroms or less after heat treating.

Figure 2E:
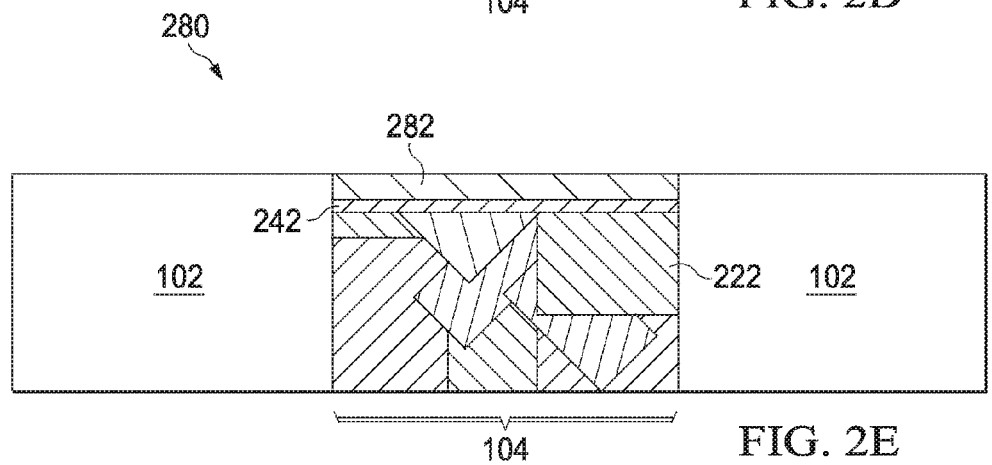
FIG. 2E is a cross-sectional diagram of a TSV structure with a barrier pad and after a second planarization.

FIG. 2E illustrates a cross-section 280 of a TSV 104 structure with a barrier pad after a second planarization. In one embodiment, the second TSV material 262 deposition may be deposited via a CVD process, with TSV material deposited on the substrate 102 as well as the in the TSV 104. Polishing the second TSV deposition 262 to form the top TSV pad 282 may advantageously remove any excess TSV material from the substrate and top TSV pad 282 surfaces and smooth the top TSV pad's 282 upper surface to planarize it with the substrate 102 target surface.

Figure 4A:
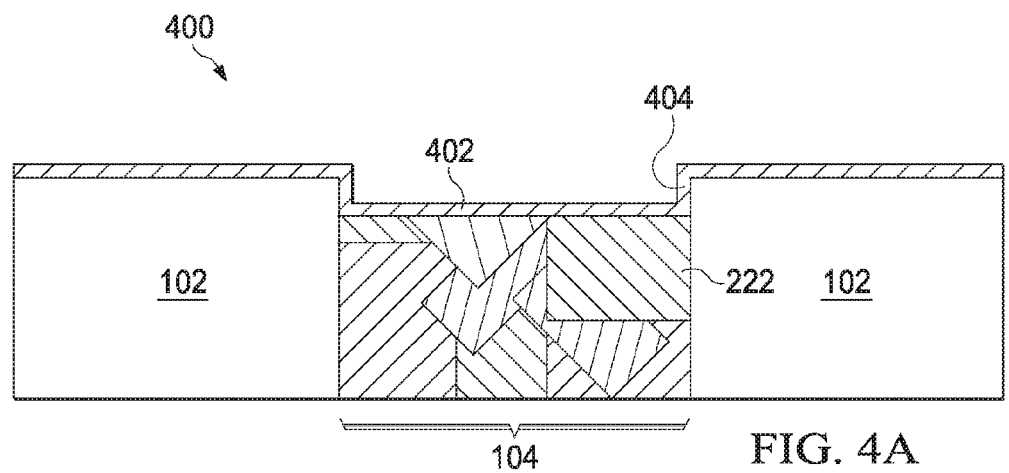
FIG. 4A is a cross-sectional diagram of a TSV structure with an alternative embodiment of a barrier pad.

FIG. 4A illustrates a cross-section of an alternative embodiment 400 of a barrier pad. In this embodiment, a substrate 102 and TSV 104 may be filled and prepared as shown in FIGS. 2A and 2B, and the barrier pad 402 material may be applied without precise masking. Such deposition may result in barrier pad 402 material deposited across the substrate 102, or with barrier pad 402 material being deposited within the via 104 over the TSV material 222 and on the via 104 sidewalls forming barrier pad sidewalls 404. Deposition of the barrier pad 402 material may be accomplished by any advantageous process, including, but not limited to, sputtering, CVD, PECVD, electroplating or the like Skilled artisans will recognize that the presence of a barrier pad sidewall 404 would not significantly affect the performance of a top TSV pad 282.

Figure 4B:
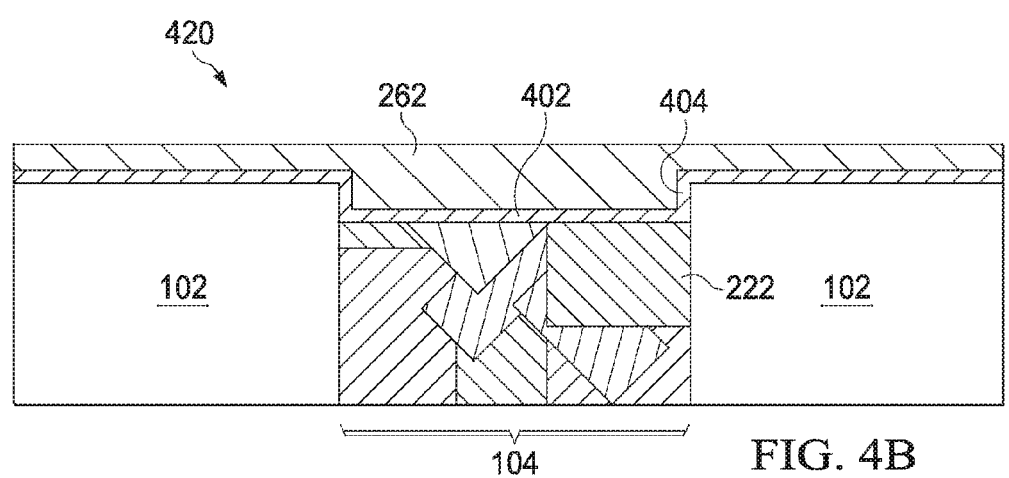
FIG. 4B is a cross-sectional diagram of a TSV structure with a second deposition of TSV material on an alternative embodiment of a barrier pad.
Figure 4C:
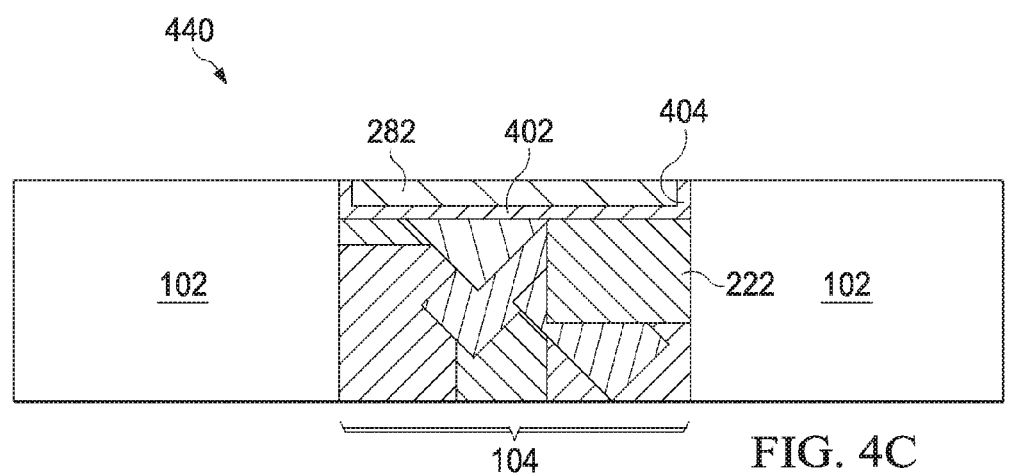
FIG. 4C is a cross-sectional diagram of a TSV structure with an alternative embodiment of a barrier pad and after a second planarization.

FIGS. 4B and 4C illustrate cross-sections of a TSV having an alternative embodiment of a barrier pad 402 with the second metal plating 262 applied 420 and planarized to form the barrier pad TSV 440. A second metal plating structure 262 may be applied directly onto the barrier pad 402 material, and may, in some embodiments, take advantage of any masking used to deposit the barrier pad 402 material. The second metal structure 262 deposition process may also be performed using any advantageous deposition technique without deviating from the present principles.

Both the second metal plating structure 262 and barrier pad 402 material may advantageously be planarized at the same time, or may be planarized in multiple steps. For example, the second metal plating structure 262 and barrier pad 402 material may be reduced to the level of the substrate 102 via a chemical mechanical polish, resulting in a top TSV pad 282 separated from the bulk of the TSV material 222 by a barrier pad 402 and barrier pad sidewalls 404.

Figure 3:
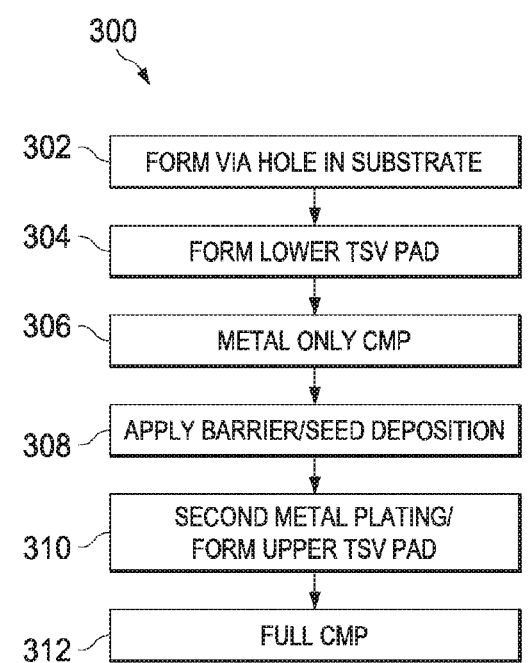
FIG. 3 is a flow diagram illustrating steps for constructing a TSV with a barrier pad.

FIG. 3 is a flow diagram 300 illustrating steps for constructing a TSV with a barrier pad. First, an existing substrate is prepared for creation of a TSV 104, including formation of a via hole in the substrate 102 in block 302. The via hole may be drilled, milled, chemically etched, or created by any other means. Additionally, any other substrate 102 preparation step may be performed at this junction, including, but not limited to, substrate 102 annealing, polishing, cleaning, doping, backside grinding, or the like. The initial metal plating to form the lower TSV pad 222 in block 304 is deposited after the substrate 102 has one or more via holes created. As discussed, supra, the first metal plating step may be CVD, electroplating, or any other suitable deposition method. Additionally, the TSV 104 via and substrate 102 may be masked prior to deposition to prevent excess TSV material 106 from being deposited in non-useful locations.

In block 306, the lower TSV pad 222 is polished, etched, or otherwise reduced, by, for example a chemical mechanical polishing (CMP) process Skilled artisans will recognize that with a maximum preferable top TSV pad 282 thickness of 6 microns, and a maximum preferable barrier pad 242 thickness of about 1 micron, the surface of the bottom TSV pad 222 will, in one useful embodiment, be reduced below the surface of the substrate 102 by less than the thickness of the top TSV pad and barrier pad, or less than 6 microns. Preferably, the bottom TSV pad 222 will be reduced below the substrate surface between about 0.1 and 3 microns, to accommodate the preferred barrier pad 242 and top TSV pad 282 thicknesses. As the reduction in the TSV bottom pad 222 below the target surface of the substrate 102 creates space for the barrier pad 242 and top TSV pad 282, the final thickness of the top TSV pad 282 can be controlled by the distance the bottom TSV pad 222 is reduced, in combination with the thickness of the barrier pad 242. A barrier layer 242 is deposited on the bottom pad 222 in block 310. Barrier layer 242 may act as a barrier to prevent large scale grain formation in the subsequently formed TSV pad 282. In some embodiments, barrier layer 242 additionally acts as a seed layer for electroplating of TSV pad 282.

A second metal plating structure 262 may be deposited in block 310 to form the top TSV pad 282, and surfaced or polished in block 312. Any suitable deposition process may be used for this deposition step, and that process need not be the same as for deposition of the barrier pad 242 or bottom TSV pad 222.

In an alternative embodiment, the barrier pad 242 may be the final pad applied to the TSV 104, and block 310 may be omitted. In such an embodiment, the barrier pad 242 may be deposited on a TSV bottom pad 222, and then reduced to a level where the preferred thickness of the barrier pad 242 is achieved at the surface of the substrate 102. Then, the full polish may be performed on the barrier pad 242 itself to surface the barrier pad 242 for attachment of connecting structures such as wire bonds or the like.

In particularly useful embodiments the final, top pad, whether the top TSV pad 282, or the barrier pad 242 will be surfaced to about the same level as the substrate 102. Additional TSV surface preparation steps may also be performed prior to bonding of an interconnection as well. For example, an anti-oxidation coating, such as an organic solderability preservative or palladium plating may be applied to a copper TSV pad to prevent copper oxidation. Alternatively a solder ball, solder paste, or a solder flux material may be applied in place or, or in addition to any other surface coating.

In addition to provide the TSV structure with the smoothest possible surface as described above, providing a high-throughput interconnection structure with the smoothest possible surface is also needed for semiconductor industries. In some embodiments, the interconnection structure is formed over integrated circuit dies. The interconnection structure may include conductive features, such as conductive lines, vias, and contact pads, formed within and over dielectrics. The interconnection structure may be disposed on a front side and/or a back side for use as a front-end interconnection structure or a back-end interconnection structure. For example, the "front-side" means a side near an active surface of a substrate, and the "back-side" means another side near a non-active surface of the substrate. Although "front-side" and "back-side" are used herein, their use is solely for convenience and ease of reference.

Like the TSV material, the conductive features of the interconnection structure are made of metallic materials, and metallic grain structures are also present in the conductive features. Any piece of metal is made up of a large number of crystal grains, which are regions of regularity in the package structure of the metallic atoms. At the grain boundaries, atoms become misaligned creating irregularities known as dislocations. The metallic grain structures may sit proud, or extending above, a target surface and results in surface irregularities. There is some tolerance for topography variations, the size of such topography variations is dependent on the size of the features in the device. For example, in devices created with 20 nanometer fabrication processes, surface features or topography variations less than about 100 angstroms may be tolerable, while in devices created with 45 nanometer fabrication processes, surface features or topography variations less than about 500 angstroms may be tolerable. However, the surface irregularity issues may get worse as the size of metallic grain structures increases, and the metallic grain structures of the conductive features may regrow to larger grain metallic structures after thermal heating or even only disposed at room temperature. A passivation layer (such as inter-layer dielectrics or a post-passivation layer) lying on the conductive features would have unsatisfactory characteristics if the surface irregularities of the conductive features become intolerable due to the size increment of the metallic grain structures. In some embodiments, the unsatisfactory characteristics of the dielectric layer and the conductive features results in current leakage, short connection and oxidization of the conductive features.

FIGS. 5A through 5I illustrate cross-sectional views of intermediate steps in forming a semiconductor device 500 that includes an interconnection structure having a confinement layer in accordance with some embodiments of the present disclosure. It should be understood that the interconnection structure as shown in FIGS. 5A through 5I is provided for illustrative purposes only, the interconnection structure may be applied to various substrates (e.g., a device substrate or an interposer substrate), semiconductor devices and package structures. In addition, although the interconnection structure can include a plurality of conductive and dielectric features, only a top portion of the interconnection structure is shown for clarity and simplicity of illustration.

With reference now to FIG. 5A, illustrated is a cross-sectional diagram of a semiconductor device 500 in accordance with some embodiments of the present disclosure. In some embodiments, the semiconductor device 500 includes a TSV structure 504 embedded in the substrate 502. The TSV structure 504 includes a TSV material 522 (see FIG. 5D) deposited in a through via hole within the substrate 502. The substrate 502 may be a device substrate or an interposer substrate. In particularly embodiments, the TSV material 522 is copper (Cu). However, any conductive material may be advantageously used to deposit the TSV material 522 for the TSV structure 504, including, but not limited to gold (Au), nickel (Ni), nickel-gold alloys (NiAu), Titanium (Ti), aluminum (Al), molybdenum (Mo), tantalum (Ta), tungsten (W) or the like. Any suitable deposition techniques may be used to deposit the TSV material 522 for the TSV structure 504, including, but not limited to chemical vapor deposition (CVD), molecular beam epitaxy (MBE), sputtering, electroplating, or the like. In some embodiments, the TSV structure 504 has a protruding portion that protrudes from a surface 506 of the substrate 502 for the convenient formation of a contact pad (e.g., see contact pad 528 in FIG. 5E). In some other embodiments, the TSV structure 504 does not include the protruding portion but has a top surface that is level with the surface 506 of the substrate 502 (not shown). In some embodiments, the surface 506 is a non-active surface opposite to an active surface 508 of the substrate 502.

In some embodiments, the TSV structure 504 includes a barrier layer pad (not shown) formed near its top surface. The barrier pad may be made of tantalum, cobalt, titanium, nickel or the like, and has grain structures dissimilar enough from the TSV material 522 to prevent the barrier pad from acting as a seed layer for crystal growth. In some embodiments that a rough surface profile of the TSV structure 504 is tolerated, the barrier layer pad is omitted.

A passivation layer 510 is formed over the surface 506 of the substrate 502 with exposing a top of the TSV structure 504. The passivation layer 510 may include spin-on glass (SOG), silicon oxide, silicon oxynitride, silicon nitride, polyimide (PI), polybenzoxazole (PBO), or the like or multiple layers thereof. In some embodiments, the passivation layer 510 is deposited over the surface 506 of the substrate 502, and a planarization operation is then performed on the passivation layer 510 to remove a portion of the passivation layer 510 over the TSV structure 504. The passivation layer 510 is deposited by spin coating, chemical vapor deposition (CVD), plasma enhanced chemical vapor deposition (CVD) or atomic layer deposition (ALD) in some embodiments. The planarization operation includes chemical-mechanical polishing (CMP), for example.

Referring to FIG. 5B, a seed layer 512 is deposited over the surface 506 of the substrate 502. The seed layer 512 includes a seed material for a subsequent plating process. The seed layer 512 includes a metal, such as copper, a titanium, and copper alloy, other metals, alloys combinations or multiple layers thereof, for example. In some embodiments, the seed layer 512 has a thickness of about 500 Angstroms to about 5,000 Angstroms, for example. Alternatively, the seed layer may include other materials and dimensions. The seed layer 512 is formed by physical vapor deposition (PVD) or other suitable methods, for example.

Figure 5C:
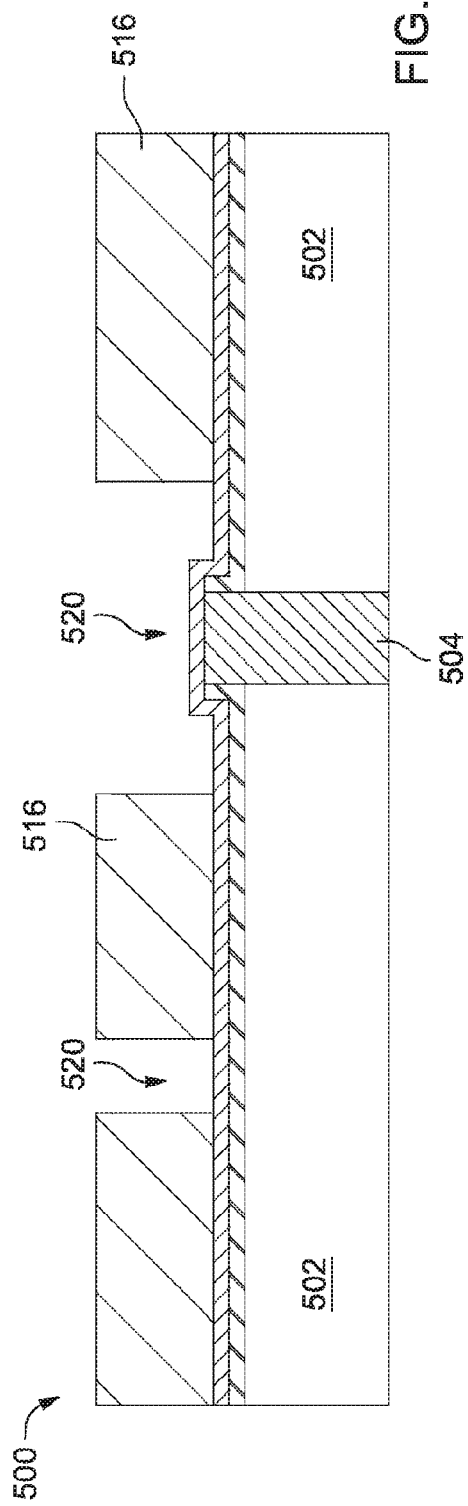

Referring to FIG. 5C, a sacrificial material 516 is formed over the seed layer 512. In some embodiments, the sacrificial material 516 includes a photoresist, an organic material, an insulating material, or other materials. The sacrificial material 516 is patterned with a desired pattern for a plurality of contact pads and conductive lines. For example, as shown in FIG. 5C, openings 520 for a contact pad and a conductive line are formed in the sacrificial material 516, although it is understood that the numbers of the openings for the contact pads and the conductive lines are not limited. The sacrificial material 516 may be patterned using a lithography process or a direct patterning process. In the lithography process, the sacrificial material 516 includes photoresist or other materials that is exposed to light or energy reflected from or transmitted through a lithography mask (not shown) that has the desired pattern thereon. The sacrificial material 516 is then developed and portions of the sacrificial material 516 are then ashed or etched away. A direct patterning process may include forming the pattern in the sacrificial material 516 using a laser or other suitable methods, for example.

Figure 5D:
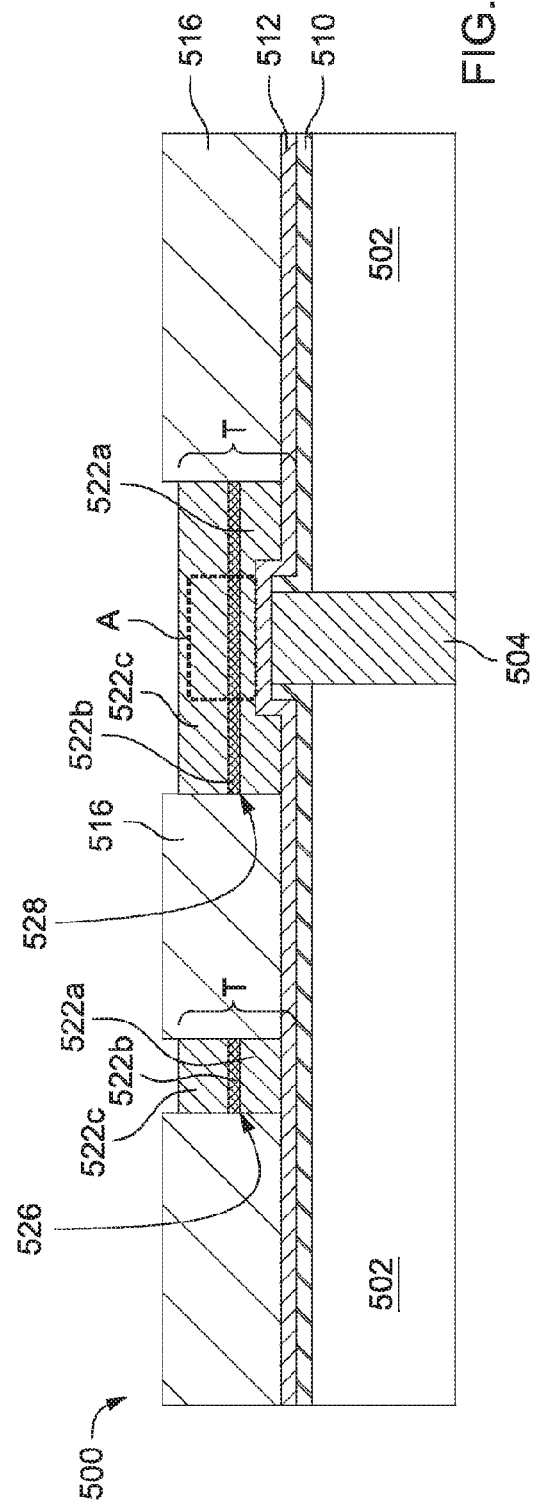

Referring to FIG. 5D, a first layer 522a of a first conductive material, a second layer 522b of a second conductive material and a third layer 522c of a third conductive material are subsequently deposited in the patterns in the sacrificial material 516 for forming a conductive line 526 and a contact pad 528. The second conductive material is made of substantially the same material as that of the first conductive material and the third conductive material. In addition, the second conductive material has a different average grain size compared to the first conductive material and the third conductive material. In an embodiment, substantially the same material described herein means that over about 99.9 wt % of each conductive material is made of the same element or alloy. For example, the first, second and third conductive materials are made of copper (Cu), which is advantageous due to its low cost. Alternatively, gold (Au), palladium (Pd), nickel (Ni), nickel-gold alloys (NiAu), Titanium (Ti), aluminum (Al), molybdenum (Mo), tantalum (Ta), tungsten (W) or the like may be used.

Figure 6:
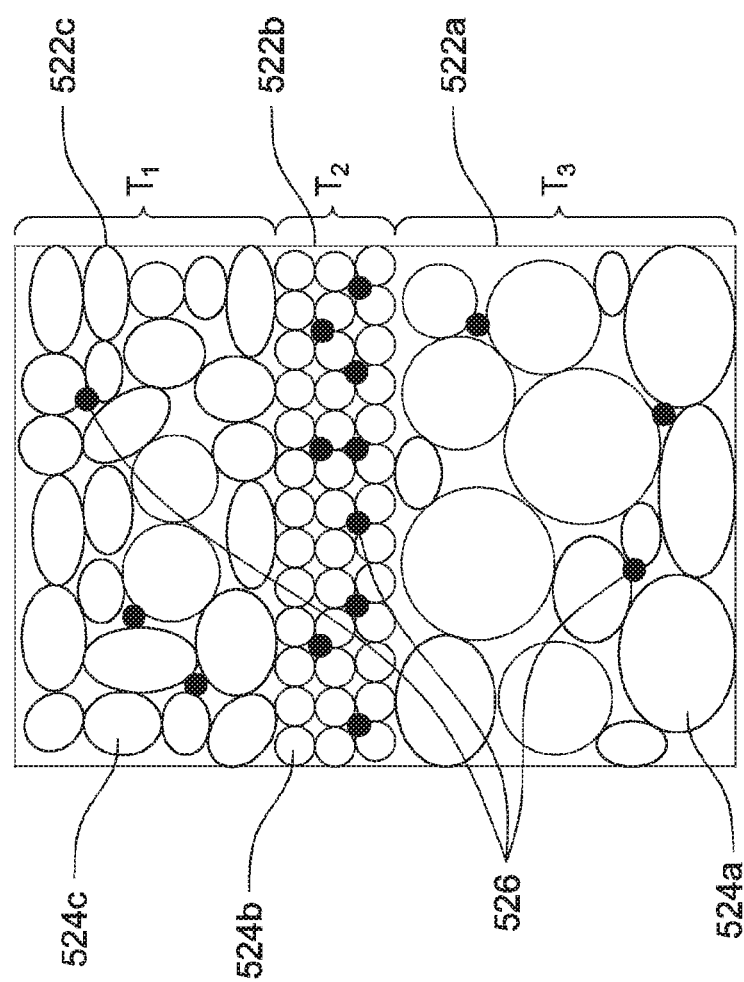
FIG. 6 is an enlarged view of a marked portion shown in FIG. 5D in accordance with some embodiments of the present disclosure.

Referring now to FIG. 6, which illustrates an enlarged view of the marked portion A in FIG. 5D, for example. The first, second and third conductive materials include first, second and third metallic grain structures 524a-524c, respectively. In some embodiments, the average grain size of the metallic grain structures 524b of the second conductive material is smaller than the metallic grain structures 524*a* and 524*c* of the first and third conductive conducive materials. For example, the metallic grain structures 524*b* of the second conductive material have an average grain size ranging from about 0.1 microns to about 0.5 microns. The metallic grain structures 524*a* of the first conductive material have an average grain size ranging from about 0.5 microns to about few microns. The metallic grain structures 524*c* of the third conductive material 524*c* have an average grain size ranging from 0.5 microns to about few microns. In some embodiments, the metallic grain structures 524*a* and the metallic grain structures 524*c* have substantially the same average grain size. In some other embodiments, the metallic grain structures 524*a* of the first conductive material and the metallic grain structures 524*c* of the third conductive material have different average grain sizes. For example, the metallic grain structures 524*c* have an average grain size smaller than that of the metallic grain structures 524*a*. In some embodiments, the average grain size of the metallic grain structures 524*b* is about 3 times to about 5 times as small as the average grains sizes of the metallic grain structures 524*a* and 524*c* for effectively affecting the grain growth in the first and third layer 522*a* and 522*c* while the first layer 522*a* and the third layer 522*c* can be deposited at a high rate.

In some embodiments, the contact pad 528 and the conductive line 526, each including the first layer 522*a*, the second layer 522*b*, the third layer 522*c* and the seed layer 512, have a thickness T ranging from about 1 microns to about 10 microns. Since the second layer 522*b* is formed in the middle of contact pad 528, the contact pad 528 is divided into multiple layers in which the layers 522*a*, 522*b* and 522*c* each has a thinner thickness as compared to a total thickness T of the contact pad 528. For example, the thickness $T_1$ of the first layer 522*a* is about 2 times to about 2.5 times as thin as the thickness of the contact pad 528, and the thickness $T_3$ of the third layer 522*c* is about 2 times to about 2.5 times as thin as the thickness of the contact pad 528. In some embodiments, the first layer may have a thickness ranging from about 1 microns to about 4 microns; and the third layer may have a thickness $T_3$ ranging from about 1 microns to about 4 microns. The thicknesses of the first and third layers 522*a* and 522*c* may be substantially the same or different from each other. In addition, the second layer 522*b* should also be deposited in a thin enough layer to prevent large scale grain formation in the second layer 522*b* itself. The second layer has a thickness $T_2$ ranging from about 0.1 microns to about 0.5 microns, for example. The second layer 522*b* acts as a confinement layer which ensures that the metallic grain structures 524*a* and 524*c* can only regrow within the respective confines of the first layer 522*a* and the third layer 522*c*. As described above, the first layer 522*a* and the third layer 522*c* are thinner than the total thickness of the contact pad 528, and thus the metallic grain structures 524*a* and 524*c* have limited diameter if grain growth occurred. Accordingly, in some embodiments, the contact pad has 528 and the conductive line 526 has a topography variation (including top surface and sidewall surfaces) of less than about 1 micron after thermal heating.

In some embodiments, the first, second and third layers 522*a*-522*c* are deposited by a multi-step electroplating operation. Electroplating is a cost-effective and efficient method for depositing an inexpensive conductive material to form the conductive materials of the layers 522*a*-522*c*. In addition, the different sizes of the metallic grain structures 524*a*-524*c* of the first, second and third conductive materials may be formed by adjusting the plating conditions in each step of the multi-step electroplating operation. For example, the sizes of the metallic grain structures 524*a*-524*c* in the layers 522*a*-522*c* may be controlled by adjusting the plating rate. In some embodiments, the plating rate is controlled by adjusting current density, bath temperature, the selection of a plating bath solution and/or other conditions. The average size of the metallic grain structures 524*b* of the second conductive material is smaller than that of the metallic grain structures 524*a* and 524*c* due to a lower plating rate. In some embodiments, the plating rates of depositing the first layer 522*a* and the third layer 522*c* are about 2 times to about 10 times as fast as the plating rate of depositing the second layer 522*b*, for achieving a high throughput goal. In some embodiments, the desired thickness is obtained by adjusting the plating time period. In accordance with some embodiments, the throughput of the conductive line 526 and the contact pad 528 is not substantially reduced since the second layer 522*b*, which is deposited at a lower plating rate, is relatively thin and requires a relatively short formation time. In some embodiments, the multi-step electroplating operation includes selecting a plating bath solution which contains copper salts, such as $CuSO_4$, with additives, such as levelers, accelerators, and suppressors. In some embodiments, the desired thicknesses of layers 522*a*-522*c* are obtained by adjusting the plating time period.

By providing different sizes of the metallic grain structures 524*a*-524*c* in the first, second and third conductive materials, it is also found that different concentrations of impurities 526 (see FIG. 6) are present in each conductive material. In embodiments wherein the first, second and third conductive materials are made of copper, the impurities 526 include nitrogen, sulfur, carbon, oxygen or a combination thereof, or other impurities possibly present in the deposited copper material. In some embodiments, the first conductive material has a first impurity concentration ranging from about 50 ppm to about 100 ppm. The second conductive material has a second impurity concentration ranging from about 100 ppm to about 300 ppm. The third conductive material has a third impurity concentration ranging from about 50 ppm to about 100 ppm. The second conductive material may have a higher impurity concentration than that of the first conductive material and the third conductive material. In some embodiments, the impurity concentration of the second conductive material is about 2 times to about 10 times as high as that of the first and third conductive materials. The higher impurity concentration of second conductive material would not substantially affect the conductivity of the contact pad 528 and the conductive line 526 because the impurity concentration are very small relative to the main material such as copper.

Referring to FIG. 5E, the sacrificial material 516 is removed, and the exposed portions of the seed layer 512 are then removed. The conductive line 526 and the contact pad 528, each including the first, second and third layers 522*a*-522*c* and the remaining seed layer 512', are exposed. In some embodiments, the conductive line 526 may function as a post-passivation line, also sometimes referred to as a post passivation interconnect (PPI). The contact pad 528 includes an under bump metallization structure in some embodiments that is arranged in a ball grid array or other patterns of arrangements.

Referring to FIG. 5F, another passivation layer 550 is formed over the surface 506 of the substrate 502. As shown in FIG. 5F, the passivation layer 550 covers the surface 506 of the substrate 502, the conductive line 526 and the contact pad 528 in a conformal manner. The passivation layer 550 may include a solder resist (SR), polyimide (PI), polybenzoxazole (PBO), spin-on glass (SOG), silicon oxide, silicon oxynitride, silicon nitride, or the like or multiple layers thereof in some embodiments. The passivation layer 550 has a thickness ranging from about 0.2 microns to about 2.0 microns, for example. Alternatively, the passivation layer 550 includes other materials and dimensions. The passivation layer 550 is formed by, for example, chemical vapor deposition (CVD), plasma enhanced chemical vapor deposition (PECVD) or other suitable deposition techniques.

Referring to FIG. 5G, another sacrificial material 552 is formed over the surface 506 of the substrate 502. The sacrificial material 552 includes a photoresist, an organic material, an insulating material, or other materials. The sacrificial material 552 is patterned and includes an opening 554 exposing at least a portion of the contact pad 528. The opening 554 may be formed using a lithography process or a direct patterning process. In the lithography process, the sacrificial material 552 is exposed to light or energy reflected from or transmitted through a lithography mask (not shown) that has the desired pattern thereon. The sacrificial material 552 is then developed. A direct patterning process may include forming the opening 554 in the sacrificial material 552 using a laser or other suitable methods, for example.

Figure 5I:
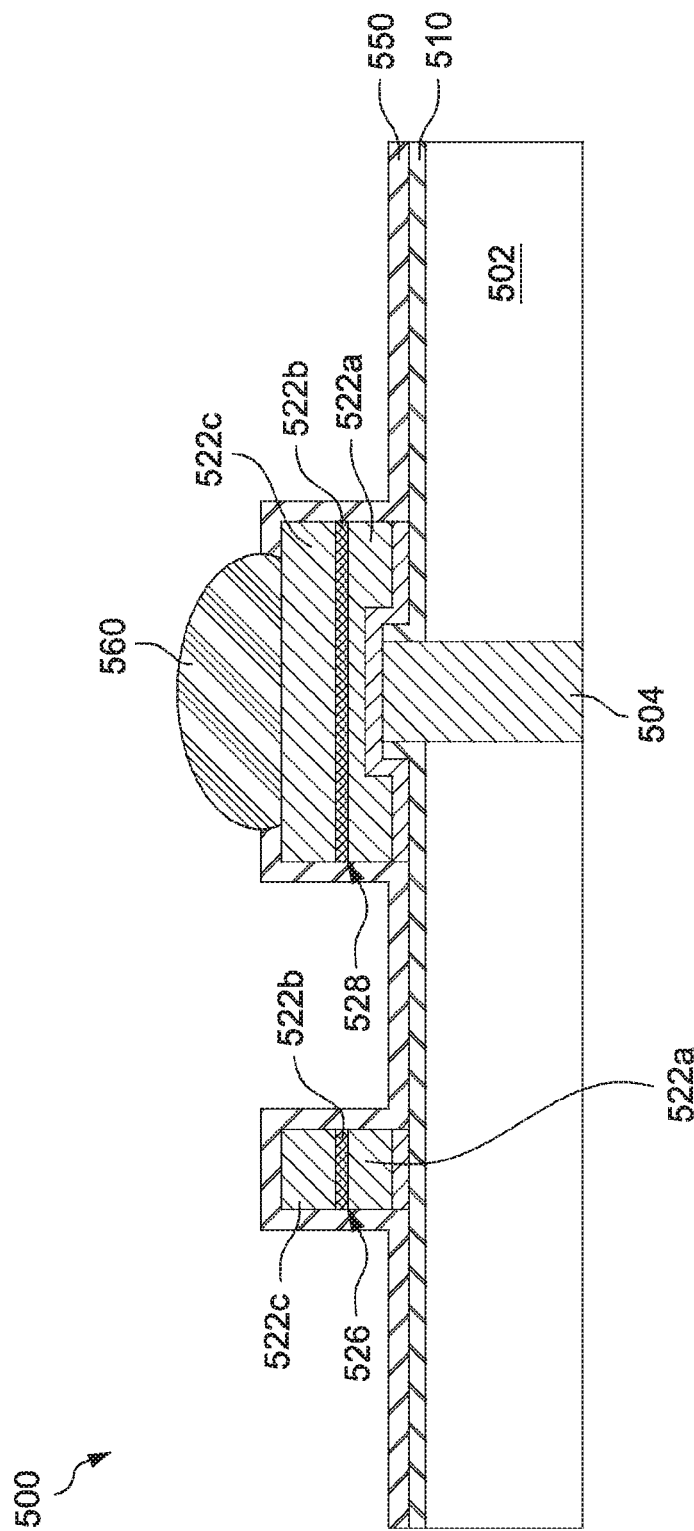

Referring to FIG. 5H, a portion of the passivation layer 550 in the opening 554 is removed using the sacrificial material 552 as a mask. The contact pad 528 is exposed through an opening 556. Referring to FIG. 5I, in some embodiments, a connector 560 is then coupled to the contact pad 528 through the opening 556. The connector 560 includes a eutectic material such as solder, for example. The eutectic material includes a solder ball or solder paste in some embodiments that is reflowed by heating the eutectic material to a melting temperature of the eutectic material. The eutectic material is placed in the opening 554 using a reticle, for example. The eutectic material is then allowed to cool and re-solidify, coupling the connector 560 to the contact pad 528. The connector 560 may include other types of electrical connectors, such as microbumps, controlled collapse chip connection (C4) bumps, or pillars, and may include conductive material such as Cu, Sn, Ag, Pb, or the like. The sacrificial material 552 may be removed before or after the connector 560 is coupled to the contact pad 528.

Figure 7A:
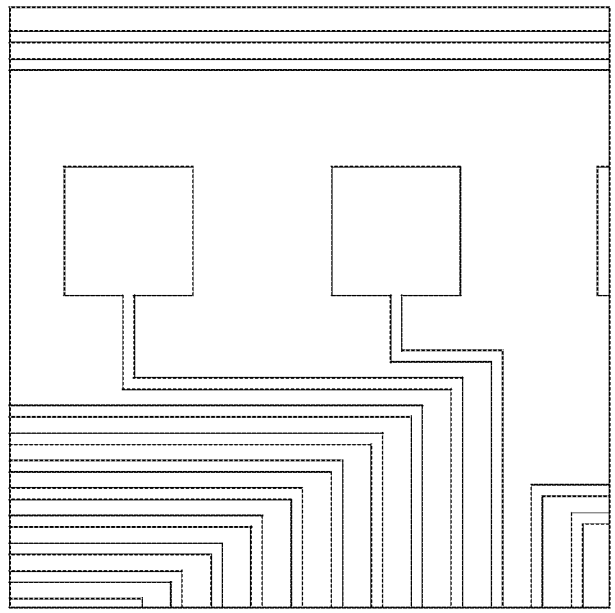
FIGS. 7A and 7B show optical microscope images of top views of contact pads in accordance with some embodiments of the present disclosure.
Figure 7B:
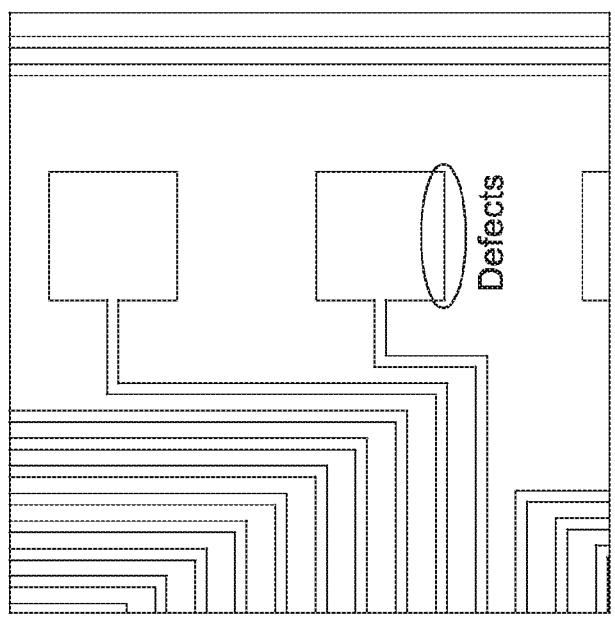

Note that improved topography variations of the contact pad 528 may also provide improved accuracy of placement of the connector 560. FIGS. 7A and 7B show optical microscope images of top views of contact pads formed without forming a confinement layer and contact pads formed with forming a confinement layer, respectively. As shown in FIG. 7A, some black smudge-like defects are displayed on the top surface of contact pads and make the edges of the contact pads possible to be confused with the background. In comparison, FIG. 7B that shows the contact pads can have smoother top surfaces and substantially no black smudge-like defects, thereby can be clearly identified from the background.

Figure 8:
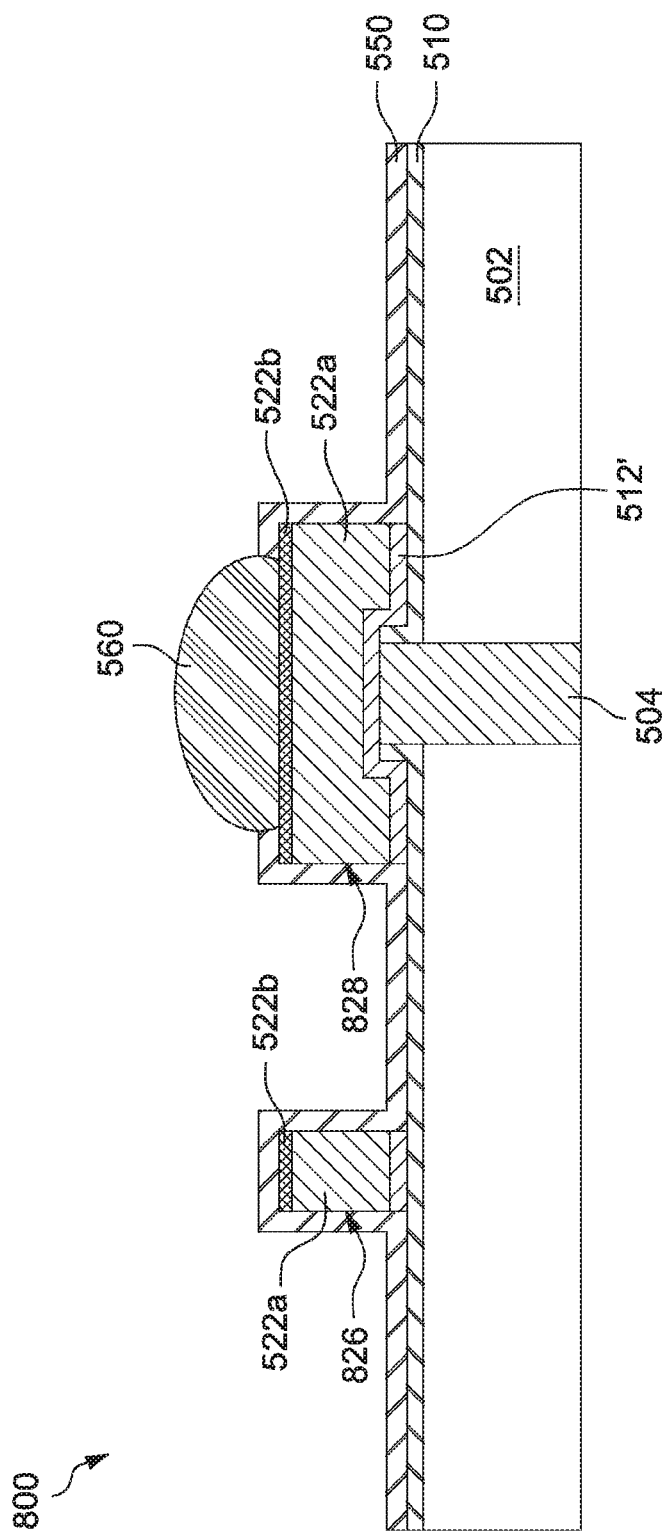
FIGS. 8-10 are cross-sectional diagrams of semiconductor devices in accordance with various alternative embodiments of the present disclosure.

With reference now to FIG. 8, a cross-sectional diagram of a semiconductor device 800 is illustrated in accordance with some alternative embodiments of the present disclosure. In some embodiments, the semiconductor device 800 includes the TSV structure 504 protruding from the surface 506 of the substrate 502. In some embodiments, the TSV structure 504 has a top surface level with the surface 506 of the substrate 502 (not shown). The semiconductor device 800 includes an interconnection structure that includes a conductive line 826 and a contact pad 828 formed over the surface 506 of the substrate 502. In an embodiment, the contact pad 828 is disposed over the TSV structure 504 and the conductive line 826 is disposed adjacent to the TSV structure 504. In some embodiments, the conductive layer 826 and the contact pad 828 include at least two layers in which the top layer of the contact pad 828 is the second layer 522b of the second conductive material. A layer under the top layer 522b is the first layer 522a of the first conductive material. The seed layer 512' is formed between the first layer 522a and the TSV structure 504. The passivation layer 550 covers the contact pad 828 and the conductive line 826 in a conformal manner and has an opening exposing the contact pad 828. The connector 560 may be coupled to the contact pad 828 through the opening. In semiconductor device 800, a better surface profile at the top corners of the contact pad 828 and conductive line 826 is provided because the top layer includes smaller metallic grain structures. A better finish at the top corners of the contact pad 828 and the conductive line 826 may be obtained. In addition, an improved top surface profile of the contact pad 828 may be also obtained.

Figure 9:
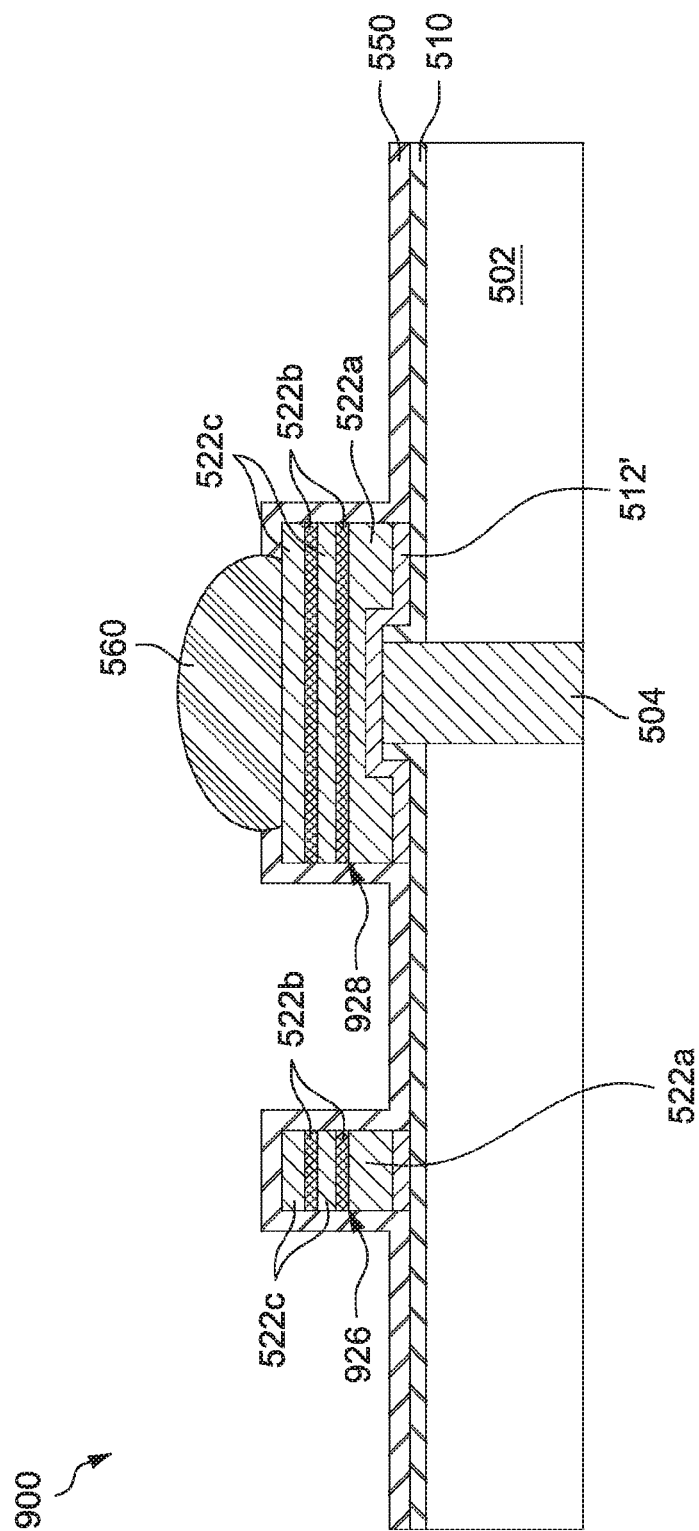

With reference now to FIG. 9, a cross-sectional diagram of a semiconductor device 900 is illustrated in accordance with some embodiments of the present disclosure. The semiconductor device 900 is similar with the semiconductor device 500 except that the contact pad 928 and the conductive line 926 each includes a plurality of the second layers 522b. The plurality of second layers 522b may further reduce the thicknesses of other layers in the contact pad 928 and the conductive line 926. As such, the performance of confining the regrowth of metallic grain structures may be improved.

Figure 10:
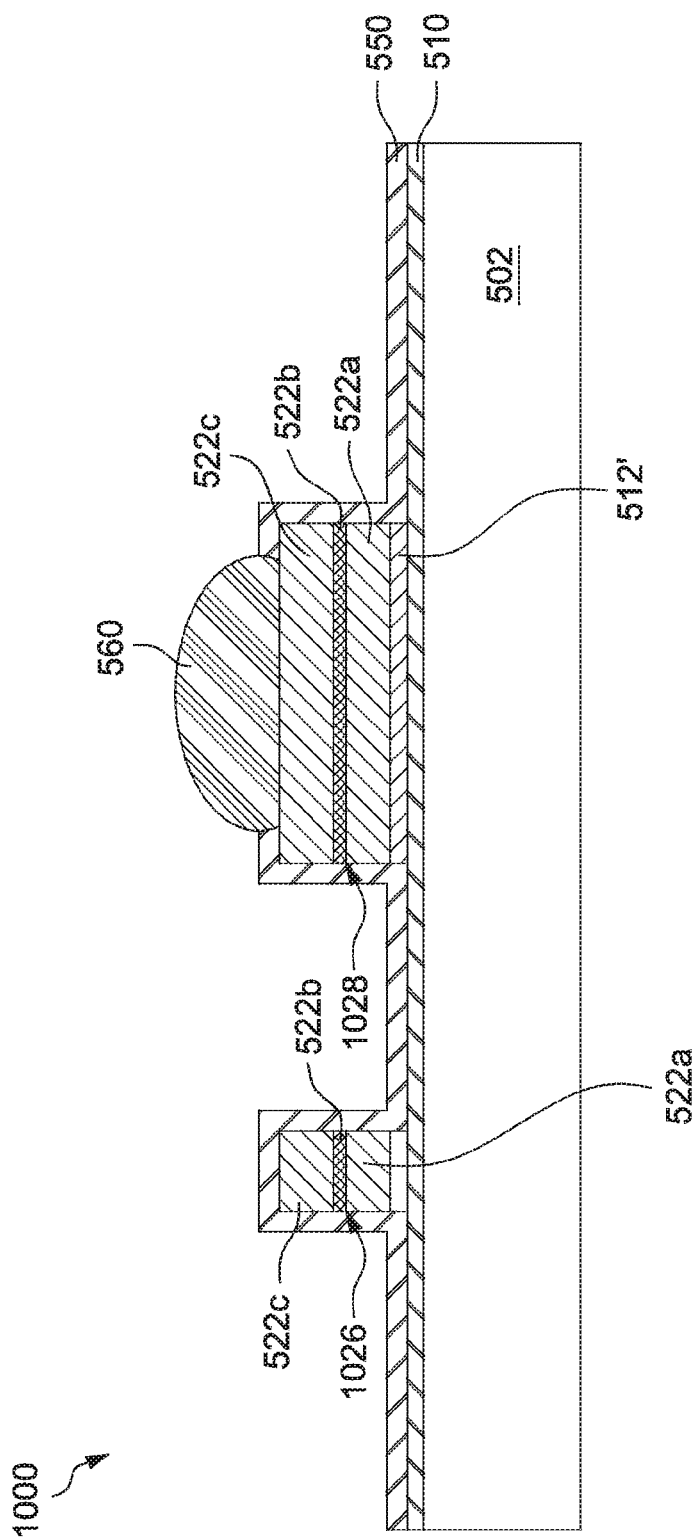

With reference now to FIG. 10, a cross-sectional diagram of a semiconductor device 1000 is illustrated in accordance with some embodiments of the present disclosure. FIG. 10 shows that a contact pad 1028 and a conductive line 1026 of the interconnection structure may be implemented independent of a TSV structure. The contact pad 1028 and the conductive line 1026 may have similar structures with the contact pad 528 and the conductive line 526 except the contact pad 1028 has a flat bottom and no TSV structure is formed underneath. The contact pad 1028 and the conductive line 5026 may be formed by similar methods with the contact pad 528 and the conductive line 526.

Figure 11:
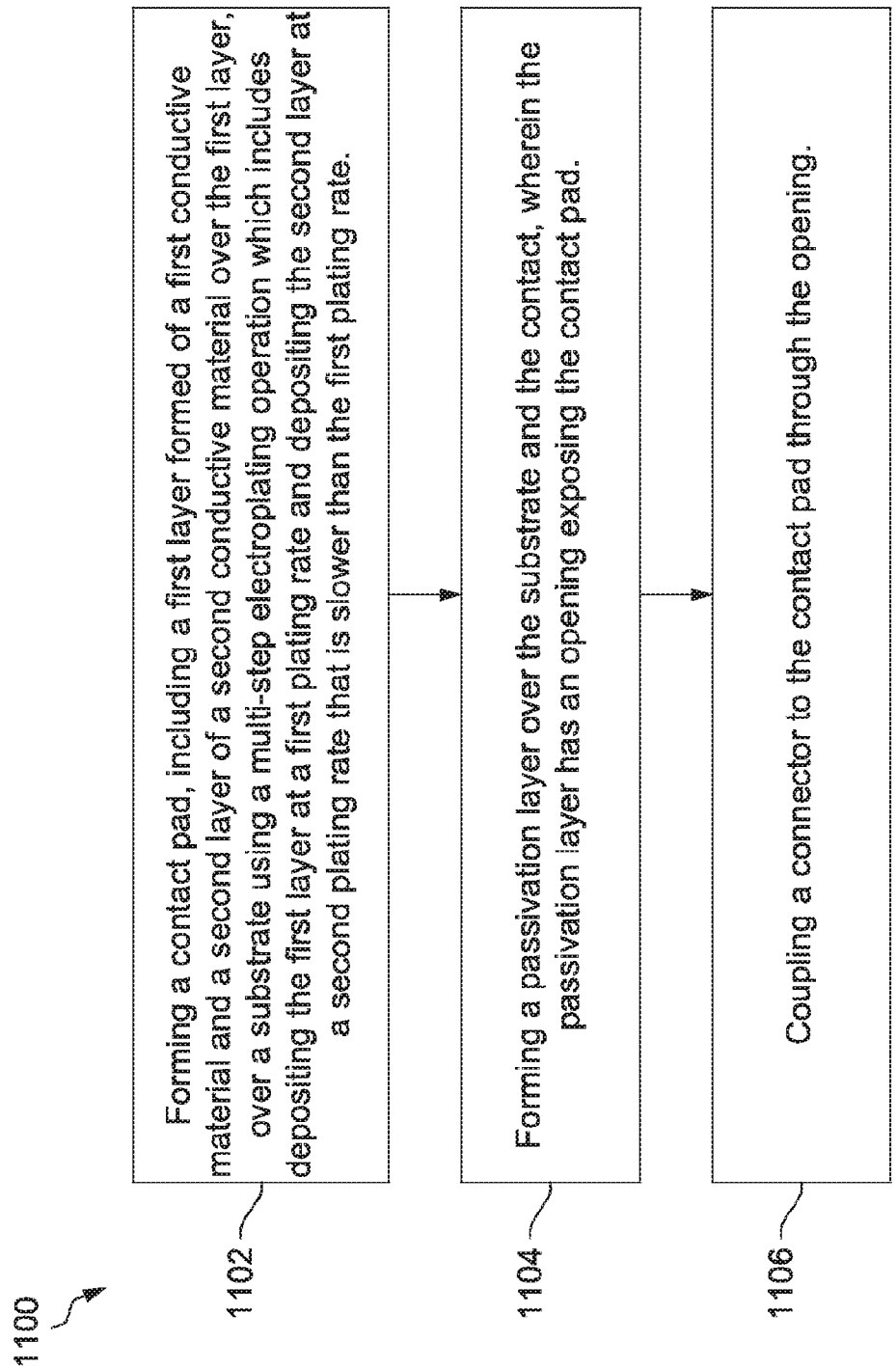
FIG. 11 is a flow chart illustrating a method of forming a semiconductor device that includes an interconnection structure having a confinement layer in accordance with some embodiments of the present disclosure.

FIG. 11 is a flow chart illustrating a method 1100 of forming a semiconductor device which includes an interconnection structure having a confinement layer in accordance with some embodiments of the present disclosure. The method 1100 includes operation 1102, wherein a contact pad, including a first layer of a first conductive material and a second layer of a second conductive material over the first layer, is formed over a substrate using a multi-step electroplating operation which includes depositing the first layer at a first plating rate and depositing the second layer at a second plating rate that is slower than the first plating rate. In some embodiments, a conductive line is also formed of the plurality of layers over the surface of the substrate. In some embodiments, the second layer has an average grain size smaller than that of the first layer. In some embodiments, the second layer has an impurity concentration higher than that of the first layer. The method 1100 continues with operation 1104, wherein a passivation layer is formed over the substrate and the contact pad, wherein the passivation layer has an opening exposing the contact pad. The method 1100 continues with operation 1106, in which a connector is coupled to the contact pad through the opening.

The embodiments of the present disclosure offer advantages over existing art, though it is understood that other embodiments may offer different advantages, not all advantages are necessarily discussed herein, and that no particular advantage is required for all embodiments. By utilizing the disclosed semiconductor device and its manufacturing method, the fitness between a contact pad and a passivation layer lying thereon can be sustainably maintained after various processes without losing throughput. The semiconductor device also provides a higher accuracy for the placement of a connector onto the contact pad.

Thus, the present disclosure provides a semiconductor device in accordance with some embodiments. The semiconductor device includes a contact pad disposed over a substrate. The contact pad includes a first layer of a first conductive material and a second layer of a second conductive material over the first layer. The first conductive material and the second conductive material are made of substantially the same material. The first conductive material has a first average grain size and the second conductive material has a second average grain size that is smaller than the first average grain size. The semiconductor device also includes a passivation layer covering the substrate and the contact pad, and the passivation layer has an opening exposing the contact pad. The semiconductor device further includes a connector coupled to the contact pad through the opening.

The present disclosure also provides a semiconductor device in accordance with some other embodiments. The semiconductor device includes a substrate having an active surface and a non-active surface opposite to the active surface. The semiconductor device also includes a through silicon via (TSV) structure embedded in the substrate, and the TSV structure includes a protruding portion protruding from the non-active surface. The semiconductor device further includes a contact pad disposed over the protruding portion of the TSV structure. The contact pad includes a first layer of a first conductive material and a second layer of a second conductive material over the first layer. The first conductive material and the second conductive material are made of substantially the same material. The first conductive material has a first average grain size and the second conductive material has a second average grain size that is smaller than the first average grain size. The semiconductor device further includes a passivation layer covering the substrate and the contact pad, and the passivation layer has an opening exposing the contact pad. In addition, the semiconductor device includes a connector coupled to the contact pad through the opening.

The present disclosure provides a method for manufacturing a semiconductor device in accordance with embodiments of the present disclosure. The method includes forming a contact pad, including a first layer of a first conductive material and a second layer of a second conductive material over the first conductive layer, over a substrate using a multi-step electroplating operation which includes depositing the first layer at a first plating rate and depositing the second layer at a second plating rate that is slower than the first plating rate. The method also includes forming a passivation layer over the semiconductor substrate and the contact pad. The passivation layer has an opening exposing the contact pad. The method further includes coupling a connector to the layered pad structure through the opening.

Although the present embodiments and their advantages have been described in detail, it should be understood that various changes, substitutions, and alterations can be made herein without departing from the spirit and scope of the disclosure as defined by the appended claims. It will be readily understood by those skilled in the art that many of the features and functions discussed above can be implemented using a variety or materials and orders to the processing steps. As another example, it will be readily understood by those skilled in the art that many of the steps may be performed in any advantageous order while remaining within the scope of the present disclosure.

Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A semiconductor device comprising:
   a contact pad disposed over a substrate, wherein the contact pad comprises a first layer of a first conductive material and a second layer of a second conductive material over the first layer, wherein the first conductive material and the second conductive material are made of substantially the same material, wherein the first conductive material has a first average grain size and the second conductive material has a second average grain size that is smaller than the first average grain size, wherein the second layer has an impurity concentration higher than that of the first layer;
   a passivation layer covering the substrate and the contact pad, wherein the passivation layer has an opening exposing the contact pad; and
   a connector coupled to the contact pad through the opening.

2. The semiconductor device of claim 1, wherein first average grain size is about 3 times to about 5 times as large as the second average grain size.

3. The semiconductor device of claim 1, wherein the second average grain size is in a range from about 0.1 microns to about 0.5 microns.

4. The semiconductor device of claim 1, wherein the first conductive material comprises copper, gold, palladium, nickel, gold-nickel alloy, titanium, aluminum, or a combination thereof.

5. The semiconductor device of claim 1, wherein the first layer has a thickness that is about 2 times to about 2.5 times as thin as a thickness of the contact pad.

6. The semiconductor device of claim 1, wherein the impurity comprises nitrogen, sulfur, carbon, oxygen or a combination thereof.

7. The semiconductor device of claim 1, wherein the impurity concentration of the second layer is 2 times to about 10 times as high as that of the first layer.

8. The semiconductor device of claim 1, further comprising:
   a through substrate via (TSV) structure embedded in the substrate and under the contact pad; and
   a conductive line disposed over the substrate and adjacent to the contact pad, wherein the conductive line comprises the first layer and the second layer and is covered by the passivation layer.

9. The semiconductor device of claim 1, wherein the second layer is a top layer of the contact pad.

10. The semiconductor device of claim 1, further comprising a third layer of a third conductive material over the second layer, wherein the third conductive material is made of substantially the same material as the second conductive material and has a third average grain size that is greater than the second average grain size.

11. The semiconductor device of claim 1, wherein the contact pad is disposed on an end of a through substrate via, the end protruding from a surface of the substrate.

12. A semiconductor device comprising:
a substrate having an active surface and a non-active surface opposite to the active surface;
a through substrate via (TSV) structure embedded in the substrate and having a protruding portion protruding from the non-active surface;
a contact pad disposed over the protruding portion of the TSV structure, wherein the contact pad comprises a first layer of a first conductive material and a second layer of a second conductive material over the first layer, wherein the first conductive material and the second conductive material are made of substantially the same material, wherein the first conductive material has a first average grain size and the second conductive material has a second average grain size that is smaller than the first average grain size;
a passivation layer covering the non-active surface of the substrate and the contact pad, wherein the passivation layer has an opening exposing the contact pad; and
a connector coupled to the contact pad through the opening.

13. The semiconductor device of claim 12, wherein the second layer has a thickness ranging from about 0.1 microns to about 0.5 microns.

14. The semiconductor device of claim 12, further comprising a conductive line over the substrate and adjacent to the TSV structure, wherein the conductive line comprises the first layer and the second layer and is covered by the passivation layer.

15. The semiconductor device of claim 14, wherein the conductive line is a post-passivation line.

16. The semiconductor device of claim 12, further comprising a third layer of a third conductive material over the second layer, wherein the third conductive material is made of substantially the same material as the second conductive material and has an impurity concentration lower than that of the second conductive material.

17. A method for manufacturing a semiconductor device, comprising:
forming a contact pad, including a first layer of a first conductive material and a second layer of a second conductive material over the first layer, over a substrate using a multi-step electroplating operation which comprises depositing the first layer at a first plating rate and depositing the second layer at a second plating rate that is slower than the first plating rate;
forming a passivation layer over the contact pad, wherein the passivation layer has an opening exposing the contact pad; and
coupling a connector to the contact pad through the opening.

18. The method of claim 17, further comprising forming a conductive line while forming the contact pad, wherein the conductive line comprises the first layer and the second layer.

19. The method of claim 17, wherein the first plating rate is about 2 times to about 10 times as fast as the second plating rate.

20. The method of claim 17, further comprising forming a third layer over the second layer using the multi-step electroplating operation, wherein the multi-step electroplating operation further comprises depositing the third layer at a third plating rate that is faster than the second plating rate.

* * * * *